(12) United States Patent
Ishizuka

(10) Patent No.: US 7,847,638 B2
(45) Date of Patent: Dec. 7, 2010

(54) CASCODED CIRCUIT

(75) Inventor: Shinichiro Ishizuka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 12/244,458

(22) Filed: Oct. 2, 2008

(65) Prior Publication Data

US 2009/0096526 A1 Apr. 16, 2009

(30) Foreign Application Priority Data

Oct. 3, 2007 (JP) .............................. 2007-260286

(51) Int. Cl.
*H03F 3/04* (2006.01)
(52) U.S. Cl. ...................... 330/311; 330/310
(58) Field of Classification Search ................ 330/311, 330/310

See application file for complete search history.

(56) References Cited

U.S. PATENT DOCUMENTS

| 6,316,989 | B1 | 11/2001 | Kurooka |
| 6,498,533 | B1 * | 12/2002 | Sowlati .................... 330/98 |
| 6,803,824 | B2 * | 10/2004 | Rategh et al. ............. 330/302 |
| 7,629,853 | B2 * | 12/2009 | Oishi ........................ 330/311 |

| 2007/0075784 | A1 | 4/2007 | Pettersson et al. |

FOREIGN PATENT DOCUMENTS

JP 2001-156558 A 6/2001

OTHER PUBLICATIONS

Ryuichi Fujimoto et al., "A 7-GHz 1.8-dB NF CMOS Low-Noise Amplifier", IEEE Journal of Solid-State Circuits, vol. 37, No. 7, Jul. 2002, pp. 852-856.

* cited by examiner

*Primary Examiner*—Henry K Choe
(74) *Attorney, Agent, or Firm*—Foley & Lardner LLP

(57) ABSTRACT

A cascoded current-mirror circuit includes a first N channel MOS transistor, a second N channel MOS transistor, a third N channel MOS transistor and a fourth N channel MOS transistor. The first N channel MOS transistor and the second N channel MOS transistor are cascode-connected between a higher voltage source and a lower voltage source. The third N channel MOS transistor and the fourth N channel MOS transistor are cascode-connected between the higher voltage source and the lower voltage source. A drain of the first N channel MOS transistor is connected to gates of the first N channel MOS transistor, the second N channel MOS transistor, the third N channel MOS transistor and the fourth N channel MOS transistor. The threshold voltages of the second N channel MOS transistor and the fourth N channel MOS transistor are larger than those of the first N channel MOS transistor and the third N channel MOS transistor.

14 Claims, 9 Drawing Sheets

CASCODED CIRCUIT

CROSS REFERENCE TO RELATED APPLICATION

This application is based upon and claims the benefit of priority from the prior Japanese Patent Application No. P2007-260286, filed on Oct. 3, 2007, the entire contents of which are incorporated herein by reference.

FIELD OF THE INVENTION

The present invention relates to a cascoded circuit.

BACKGROUND OF THE INVENTION

An amplifier, a constant-current circuit and the like each having cascode-connected transistors can provide high output impedance, and thus can reduce the property fluctuation caused by power supply voltage variation. In addition, the use of a semiconductor integrated circuit having cascode-connected transistors as an amplifier can decrease a feedback from an output side to an input side, and thus can improve the high frequency properties. For these reasons, the amplifier and the constant-current circuit having the cascode-connected transistors are frequently used in a variety of fields. Japanese Patent Application Publication No. 2001-156558 discloses a cascoded current-mirror circuit.

Recently, the amplifiers and the constant-current circuits operating at a low voltage have been demanded with the progress of the miniaturization, high integration, and low power consumption of the semiconductor integrated circuits. However, in a conventional cascoded current-mirror circuit and a conventional cascoded amplifier, transistors are cascode-connected between a higher voltage source and a lower voltage source, thereby causing a problem of having a small power supply voltage margin. Additionally, in the cascoded current-mirror circuit, when cascoded-connected transistors each having a multi-finger structure are formed in separate active regions, this configuration causes a problem of enlarging the area of a pattern layout of the amplifier or the constant-current circuit.

SUMMARY OF THE INVENTION

According to an aspect of the invention is provided a cascoded circuit, comprising a first transistor having a drain electrically to connect to a higher voltage source, a second transistor having a drain connected to a source of the first transistor, the second transistor having a source electrically to connect to a lower voltage source, a third transistor having a drain electrically to connect to the higher voltage source and a fourth transistor having a drain connected to a source of the third transistor, the fourth transistor having a source electrically to connect to the lower voltage source, wherein the first transistor, the second transistor, the third transistor and the fourth transistor are N channel insulated gate field effect transistors, the threshold voltages of the second transistor and the fourth transistor are larger than those of the first transistor and the third transistor, and wherein the first transistor, the second transistor, the third transistor and the fourth transistor are formed in the same active region, and gates of the first transistor, the second transistor, the third transistor and the fourth transistor are arranged in parallel with each other.

According to another aspect of the invention is provided a cascoded circuit, comprising a first transistor having a source electrically to connect to a higher voltage source, a second transistor having a source connected to a drain of the first transistor, the second transistor having a drain electrically to connect to a lower voltage source, a third transistor having a source electrically to connect to the higher voltage source and a fourth transistor having a source connected to a drain of the third transistor, the fourth transistor having a drain electrically to connect to the lower voltage source, wherein the first transistor, the second transistor, the third transistor and the fourth transistor are P channel insulated gate field effect transistors, the absolute values of the threshold voltages of the first transistor and the third transistor are larger than those of the second transistor and the fourth transistor, and wherein the first transistor, the second transistor, the third transistor and the fourth transistor are formed in the same active region, and gates of the first transistor, the second transistor, the third transistor and the fourth transistor are arranged in parallel with each other.

According to another aspect of the invention is provided a cascoded circuit, comprising a first transistor having a drain electrically to connect to a higher voltage source, a voltage being applied to a gate of the first transistor, and the first transistor outputting an output signal from the drain of the first transistor and a second transistor having a drain connected to a source of the first transistor, a source of the second transistor being electrically to connect to a lower voltage source, and an input signal being input to a gate of the second transistor, wherein the first transistor and the second transistor are N channel insulated gate field effect transistors, a threshold voltage of the second transistors is larger than that of the first transistor, and wherein the first transistor and the second transistor are formed in the same active region, and gates of the first transistor and the second transistor are arranged in parallel with each other.

DETAILED DESCRIPTION OF THE INVENTION

Embodiments of the present invention will be described with reference to the accompanying drawings.

Figure 1:
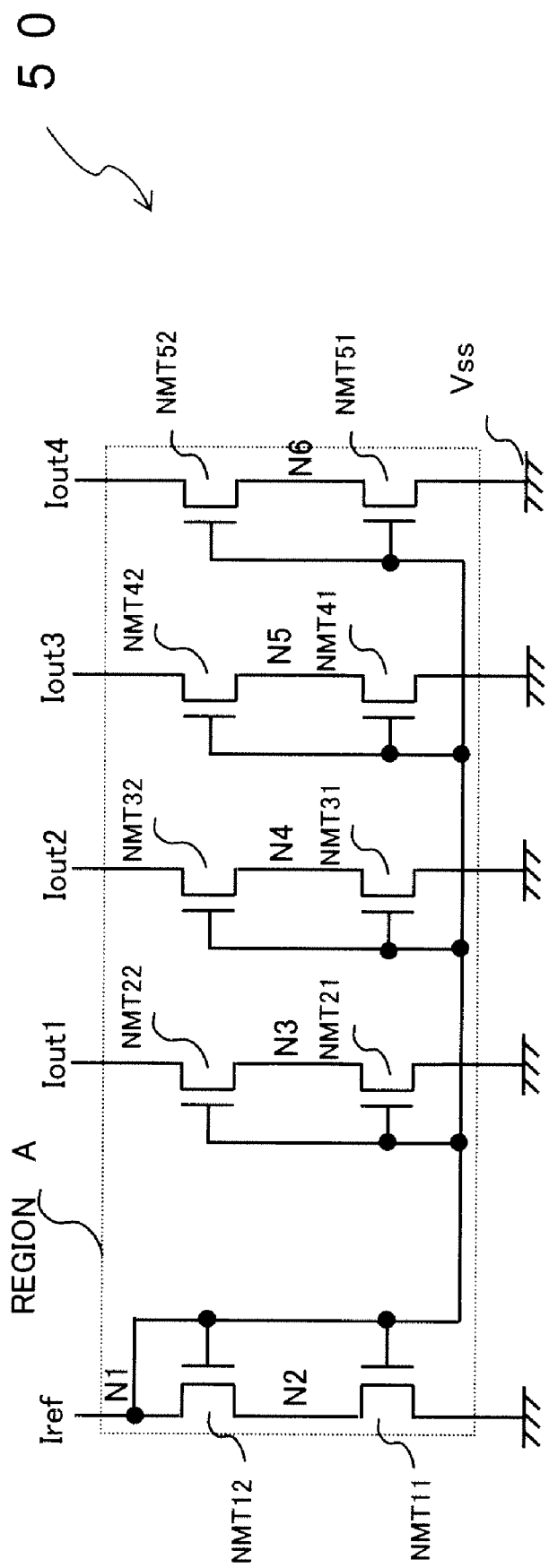
FIG. 1 is a circuit diagram that shows a cascoded current-mirror circuit according to a first embodiment of the present invention.

A cascoded circuit according to the first embodiment of the present invention will be described referring to the drawings. FIG. 1 is a circuit diagram that shows a cascoded current-mirror circuit. In this embodiment, N channel MOS transistors that constitute a cascoded current-mirror circuit that operates in a linear region is formed in the same active region.

As shown in FIG. 1, a cascoded current-mirror circuit 50 includes an N channel MOS transistor NMT11, an N channel MOS transistor NMT12, an N channel MOS transistor NMT21, an N channel MOS transistor NMT22, an N channel MOS transistor NMT31, an N channel MOS transistor NMT32, an N channel MOS transistor NMT41, an N channel MOS transistor NMT42, an N channel MOS transistor NMT51 and an N channel MOS transistor NMT52.

The N channel MOS transistor NMT11, the N channel MOS transistor NMT12, the N channel MOS transistor NMT21, the N channel MOS transistor NMT22, the N channel MOS transistor NMT31, the N channel MOS transistor NMT32, the N channel MOS transistor NMT41, the N channel MOS transistor NMT42, the N channel MOS transistor NMT51 and the N channel MOS transistor NMT52 are provided within a region A in the figure. These transistors are all E type (enhancement type) transistors (also called the normally-off type transistors). In the E type transistor, the transistor is turned off when a voltage is not supplied to the gate, and the transistor is turned on when a voltage is supplied to the gate.

In the cascoded current-mirror circuit 50, N channel MOS transistors are cascode-connected between a node N1 (located at a reference current Iref side) and a lower voltage source Vss, and the gates of the N channel MOS transistors are all connected to the node N1. Here, a lower voltage source Vss is a ground voltage. The cascoded current-mirror circuit 50 can provide high output impedance as compared to a one-stage current-mirror circuit. Thereby, the property fluctuation caused by the power supply voltage variation can be reduced.

The N channel MOS transistor NMT12 is disposed on the higher voltage source side. A drain of the N channel MOS transistor NMT12 is connected to the node N1. A gate of the N channel MOS transistor NMT12 is connected to the node N1. A source of the N channel MOS transistor NMT12 is connected to the node N2. A drain of the N channel MOS transistor NMT11 is connected to the node N2. A gate of the N channel MOS transistor NMT11 is connected to the node N1 A source of the N channel MOS transistor NMT11 is connected to the lower voltage source Vss. The N channel MOS transistor NMT11 and the N channel MOS transistor NMT12 flow the reference current Iref from the node N1 side to the lower voltage source Vss side.

The N channel MOS transistor NMT22 is disposed on the higher voltage source side. A drain of the N channel MOS transistor NMT22 is connected to the output current Iout 1 side. A gate of the N channel MOS transistor NMT22 is connected to the node N1. A source of the N channel MOS transistor NMT22 is connected to the node N3. A drain of the N channel MOS transistor NMT21 is connected to the node N3. A gate of the N channel MOS transistor NMT21 is connected to the node N1. A source of the N channel MOS transistor NMT21 is connected to the lower voltage source Vss.

The N channel MOS transistor NMT11, the N channel MOS transistor NMT12, the N channel MOS transistor NMT21 and the N channel MOS transistor NMT22 constitute a current-mirror circuit. The N channel MOS transistor NMT21 and the N channel MOS transistor NMT22 flow the output current Iout 1 from the drain side of the N channel MOS transistor NMT22 to the lower voltage source Vss side. This output current Iout 1 herein is obtained by multiplying the reference current Iref by the mirror ratio.

Herein, the mirror ratio is a transistor ratio of the N channel MOS transistor NMT21 to the N channel MOS transistor NMT11. For example, when the gate shape of the N channel MOS transistor NMT21 is the same as the shape of the N channel MOS transistor NMT11, the mirror ratio is 1. When the gate width dimension of the N channel MOS transistor NMT21 is twice the gate width dimension of the N channel MOS transistor NMT11 (the gate length sizes are the same), the mirror ratio is two.

The N channel MOS transistor NMT32 is disposed on the higher voltage source side. A drain of the N channel MOS transistor NMT32 is connected to the output current Iout 2 side. A gate of the N channel MOS transistor NMT32 is connected to the node N1. A source of the N channel MOS transistor NMT32 is connected to the node N4. A drain of the N channel MOS transistor NMT31 is connected to the node N4. A gate of the N channel MOS transistor NMT31 is connected to the node N1. A source of the N channel MOS transistor NMT31 is connected to the lower voltage source Vss.

The N channel MOS transistor NMT11, the N channel MOS transistor NMT12, the N channel MOS transistor NMT31 and the N channel MOS transistor NMT32 constitute a current-mirror circuit. The N channel MOS transistor NMT31 and the N channel MOS transistor NMT32 flow the output current Iout 2, which is obtained by multiplying the reference current Iref by the mirror ratio, from the drain side of the N channel MOS transistor NMT32 to the lower voltage source Vss side.

The N channel MOS transistor NMT42 is disposed on the higher voltage source side. A drain of the N channel MOS transistor NMT42 is connected to the output current Iout 3 side. A gate of the N channel MOS transistor NMT42 is connected to the node N1. A source of the N channel MOS transistor NMT42 is connected to the node N5. A drain of the N channel MOS transistor NMT41 is connected to the node N5. A gate of the N channel MOS transistor NMT41 is connected to the node N1. A source of the N channel MOS transistor NMT41 is connected to the lower voltage source Vss.

The N channel MOS transistor NMT11, the N channel MOS transistor NMT12, the N channel MOS transistor NMT41 and the N channel MOS transistor NMT42 constitute a current-mirror circuit. The N channel MOS transistor NMT41 and the N channel MOS transistor NMT42 flow the output current Iout 3, which is obtained by multiplying the reference current Iref by the mirror ratio, from the drain side of the N channel MOS transistor NMT42 to the lower voltage source Vss side.

The N channel MOS transistor NMT52 is disposed on the higher voltage source side. A drain of the N channel MOS transistor NMT52 is connected to the output current Iout 4 side. A gate of the N channel MOS transistor NMT52 is connected to the node N1. A source of the N channel MOS transistor NMT52 is connected to the node N6. A drain of the N channel MOS transistor NMT51 is connected to the node N6. A gate of the N channel MOS transistor NMT51 is connected to the node N1. A source of the N channel MOS transistor NMT51 is connected to the lower voltage source Vss.

The N channel MOS transistor NMT11, the N channel MOS transistor NMT12, the N channel MOS transistor NMT51 and the N channel MOS transistor NMT52 constitute a current-mirror circuit. The N channel MOS transistor NMT51 and the N channel MOS transistor NMT52 flow the output current Iout 4, which is obtained by multiplying the reference current Iref by the mirror ratio, from the drain side of the N channel MOS transistor NMT52 to the lower voltage source Vss side.

The cascoded current-mirror circuit 50 differs from a cascoded current-mirror circuit in which a current-mirror circuit is configured of two stages and operates in a saturation region. The gate of the N channel MOS transistor NMT11 on the lower voltage source Vss side is not connected to the drain. Thereby, the voltages between the gates and the sources of N channel MOS transistor NMT11, the N channel MOS transistor NMT21, the N channel MOS transistor NMT31, the N channel MOS transistor NMT41 and the N channel MOS transistor NMT51, each on the lower voltage source Vss side, can be made equal to their voltages between the drains and the sources. As a result, the N channel MOS transistor NMT11, the N channel MOS transistor NMT21, the N channel MOS transistor NMT31, the N channel MOS transistor NMT41 and the N channel MOS transistor NMT51 can operate in a linear region.

The N channel MOS transistor NMT11, the N channel MOS transistor NMT21, the N channel MOS transistor NMT31, the N channel MOS transistor NMT41 and the N channel MOS transistor NMT51 are set, for example, to the same threshold voltage Vth 1. The N channel MOS transistor NMT12, the N channel MOS transistor NMT22, the N channel MOS transistor NMT32, the N channel MOS transistor NMT42 and the N channel MOS transistor NMT52 are set, for example, to the same threshold voltage Vth 2.

The threshold voltage Vth 1 and the threshold voltage Vth 2 are set as the following formula.

$$Vth1 > Vth2 \qquad \text{Formula (1)}$$

For instance, the threshold voltage Vth 1 is set at 550 mV, and the threshold voltage Vth 2 is set at 250 mV.

When the voltages are set as in Formula (1), the voltages (voltages between the drains and the sources) applied to the N channel MOS transistor NMT12, the N channel MOS transistor NMT22, the N channel MOS transistor NMT32, the N channel MOS transistor NMT42 and the N channel MOS transistor NMT52 can be made smaller than the voltages (voltages between the drains and the sources) applied to the N channel MOS transistor NMT11, the N channel MOS transistor NMT21, the N channel MOS transistor NMT31, the N channel MOS transistor NMT41 and the N channel MOS transistor NMT51.

By the linear region operation and by the setting of two kinds of threshold voltages, the power supply voltage margin of the cascoded current-mirror circuit 50 can be made larger than that of the cascoded current-mirror circuit in which a current-mirror circuit is configured of two stages and operates in a saturation region. Thus, the cascoded current-mirror circuit 50 can operate at a low voltage. In addition, for the purpose of making the voltage of the node N3, the node N4, the node N5 and the node N6 equal to the voltage of the node N2, voltage correction means (a comparator, for example) may be disposed between the node N2 and the node N3, between the node N2 and the node N4, between the node N2 and the node N5, and between the node N2 and the node N6. By providing the voltage correction means, the output currents Iout 1 to Iout 4 can be made constant further to the low voltage region.

Figure 2:
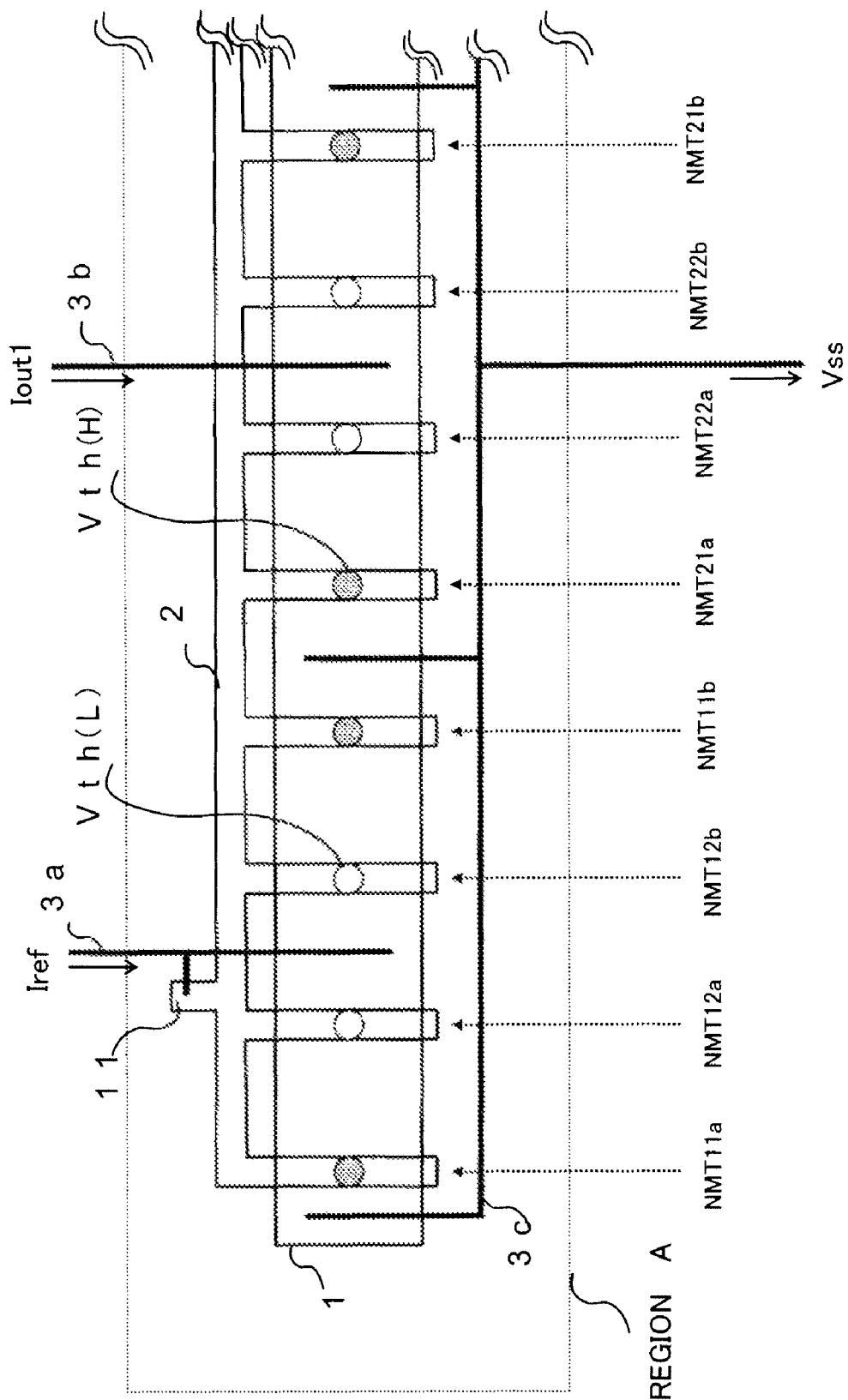
FIG. 2 is a schematic plan view that shows a pattern layout of a region A in FIG. 1.

A pattern arrangement method of a cascoded current-mirror circuit will be described referring to FIG. 2. FIG. 2 is a schematic plan view that shows a pattern layout of the region A of FIG. 1. Here, the illustrations and the descriptions of the fingers of the N channel MOS transistor NMT31 and further will be omitted.

As shown in FIG. 2, the N channel MOS transistor NMT11, the N channel MOS transistor NMT12, the N channel MOS transistor NMT21, the N channel MOS transistor NMT22, the N channel MOS transistor NMT31, the N channel MOS transistor NMT32, the N channel MOS transistor NMT41, the N channel MOS transistor NMT42, the N channel MOS transistor NMT51 and the N channel MOS transistor NMT52 are arranged and formed in the same active region 1. The gates of these transistors are arranged to be parallel with each other, and each gate (gate electrode) has a two-finger structure. The shape of the active region 1 is a rectangle. The gate electrodes of these transistors are bundled into one gate electrode/gate wiring (poly gate) 2. The gate lengths of the finger parts are formed into the same size, and the gate widths of the finger parts are formed into the same size. In addition, the two-finger structure refers to a structure with two gates (gate electrodes). An active region refers to a region which is separated by a device isolation region such as STI or LOCOS and in which a transistor is formed.

The N channel MOS transistor NMT11 has N channel MOS transistor finger parts NMT11a and NMT11b. The N channel MOS transistor NMT12 has N channel MOS transistor finger parts NMT12a and NMT12b. The N channel MOS transistor NMT21 has N channel MOS transistor finger parts NMT21a and NMT21b. The N channel MOS transistor NMT22 has N channel MOS transistor finger parts NMT22a and NMT22b. The N channel MOS transistor finger parts are arranged in parallel with each other in the X direction of the active region 1.

The N channel MOS transistor finger part NMT11a is a high threshold transistor Vth (H). The N channel MOS transistor finger part NMT11a is provided at the end of the active region 1, and has a source disposed on the end side of the active region 1. A wiring metal 3c connected to the lower voltage source Vss is provided to the source of the N channel MOS transistor finger part NMT11a.

The N channel MOS transistor finger part NMT12a is a low threshold transistor Vth (L). The source of the N channel MOS transistor finger part NMT12a shares the same diffused layer with the drain of the N channel MOS transistor finger part NMT11a. The wiring metal 3a connected to the reference current Iref side is provided to the drain of the N channel MOS transistor finger part NMT12a. The high threshold transistor Vth (H) and the low threshold transistor Vth (L) can be formed by, for example, changing the channel ion implantation conditions for threshold voltage adjustment (such as a channel dosage).

The N channel MOS transistor finger part NMT12b is a low threshold transistor Vth (L). The drain of the N channel MOS transistor finger part NMT12b shares the same diffused layer with the drain of the N channel MOS transistor finger part NMT12a. The wiring metal 3a connected to the reference current Iref side is provided to the drain of the N channel MOS transistor finger part NMT12b.

The N channel MOS transistor finger part NMT11b is a high threshold transistor Vth (H). The drain of the N channel MOS transistor finger part NMT11b shares the same diffused layer with the source of the N channel MOS transistor finger part NMT12b. The wiring metal 3c connected to the lower voltage source Vss is provided to the source of the N channel MOS transistor finger part NMT11b.

The N channel MOS transistor finger part NMT21a is a high threshold transistor Vth (H). The source of the N channel MOS transistor finger part NMT21a shares the same diffused layer with the source of the N channel MOS transistor finger part NMT11b. The wiring metal 3c connected to the lower voltage source Vss is provided to the source of the N channel MOS transistor finger part NMT21a.

The N channel MOS transistor finger part NMT22a is a low threshold transistor Vth (L). The source of the N channel MOS transistor finger part NMT22a shares the same diffused layer with the drain of the N channel MOS transistor finger part NMT21a. The wiring metal 3b connected to the output current Iout 1 side is provided to the drain of the N channel MOS transistor finger part NMT22a.

The N channel MOS transistor finger part NMT22b is a low threshold transistor Vth (L). The drain of the N channel MOS transistor finger part NMT22b shares the same diffused layer with the drain of the N channel MOS transistor finger part NMT22a. The wiring metal 3b connected to the output current Iout 1 side is provided to the drain of the N channel MOS transistor finger part NMT22b.

The N channel MOS transistor finger part NMT21b is a high threshold transistor Vth (H). The drain of the N channel MOS transistor finger part NMT21b shares the same diffused layer with the source of the N channel MOS transistor finger part NMT22b. The wiring metal 3c connected to the lower voltage source Vss is provided to the source of the N channel MOS transistor finger part NMT21b.

The N channel MOS transistor finger parts NMT11a, NMT11b, NMT12a, NMT12b, NMT21a, NMT21b, NMT22a and NMT22b are arranged to be parallel with each other, bundled together outside the active region 1, and connected to the wiring metal 3a connected to the reference current Iref side through a connection part 11.

In this embodiment, the mirror ratio of the cascoded current-mirror circuit 50 is set at one. When the mirror ratio is changed, this change can be coped with by altering the dimension in the transverse direction of the active region 1 and by appropriately inserting a transistor finger part. In this case, the location of the source or the drain does not need to be considered.

On the other hand, when the N channel MOS transistor NMT11, the N channel MOS transistor NMT21, the N channel MOS transistor NMT31, the N channel MOS transistor NMT41 and the N channel MOS transistor NMT51, which have the same threshold voltage Vth 1, and the N channel MOS transistor NMT12, the N channel MOS transistor NMT22, the N channel MOS transistor NMT32, the N channel MOS transistor NMT42 and N channel MOS transistor NMT52, which have the same threshold voltage Vth 2, are arranged and formed in separate regions, the order of the sources or the drains needs to be matched. In particular, when the number of the fingers is an odd number, a finger for adjustment needs to be inserted.

As a result, in this embodiment, the area of the pattern layout can be reduced as compared with the case where transistors are provided in separate active regions. In addition, when transistors constituting a cascoded current-mirror circuit are provided in separate active regions, the characteristics of the transistors, such as a threshold voltage, are varied by being influenced by the stress from the STI and the like forming the device isolation region. In particular, the difference in the dimensions of the separate active regions in the width direction of the gates of the transistors makes the situation more remarkable. On the other hand, this embodiment can suppress the stress and reduce the variation of characteristics of the transistors.

As described above, the cascoded circuit of this embodiment is provided with the N channel MOS transistors NMT11, NMT12, NMT21, NMT22, NMT31, NMT32, NMT41, NMT42, NMT51 and NMT52. The N channel MOS transistor NMT12, the N channel MOS transistor NMT22, the N channel MOS transistor NMT32, the N channel MOS transistor NMT42 and the N channel MOS transistor NMT52 are respectively cascode-connected to the N channel MOS transistor NMT11, the N channel MOS transistor NMT21, the N channel MOS transistor NMT31, the N channel MOS transistor NMT41 and the N channel MOS transistor NMT51. The drain of the N channel MOS transistor NMT12 is connected to the gates of the N channel MOS transistors NMT11, NMT12, NMT21, NMT22, NMT31, NMT32, NMT41, NMT42, NMT51 and NMT52. The cascoded current-mirror circuit 50 operates in a linear region. The threshold voltages of the N channel MOS transistors NMT11, NMT21, NMT31, NMT41 and NMT51, which are disposed on the lower voltage source Vss side, is set larger than the threshold voltages of the N channel MOS transistors NMT12, NMT22, NMT32, NMT42 and NMT52. The gates of the N channel MOS transistors NMT11, NMT12, NMT21, NMT22, NMT31, NMT32, NMT41, NMT42, NMT51 and NMT52 are arranged in the active region 1 to be parallel with each other.

Therefore, the power supply voltage margin of the cascoded current-mirror circuit 50 can be enlarged as compared with the case where the threshold voltages of the N channel MOS transistors are identical. Thereby, the cascoded current-mirror circuit 50 can operate at a low voltage. Moreover, the power supply voltage margin of the cascoded current-mirror circuit 50 can be made larger than that of a cascoded current-mirror circuit in which a current-mirror circuit is configured of two stages and operates in a saturation region. Thereby, the cascoded current-mirror circuit 50 can operate at a low voltage. Furthermore, the area of the pattern layout of the cascoded current-mirror circuit 50 can be reduced as compared with the case where N channel MOS transistors constituting a cascoded current-mirror circuit are arranged and formed in separate active regions. The variation of characteristics of a transistor can be decreased.

Additionally, in this embodiment, the N channel MOS transistors operate in a linear region by cascode-connecting the N channel MOS transistors and by connecting the gates to each other, the N channel MOS transistors constituting the cascoded current-mirror circuit 50 and having different threshold voltages. This can be applied also to a cascoded current-mirror circuit in which a current-mirror circuit is configured of two stages and operates in a saturation region. In this case also, the area of the pattern layout can be reduced as compared with the case where transistors are provided in separate active regions.

Figure 3:
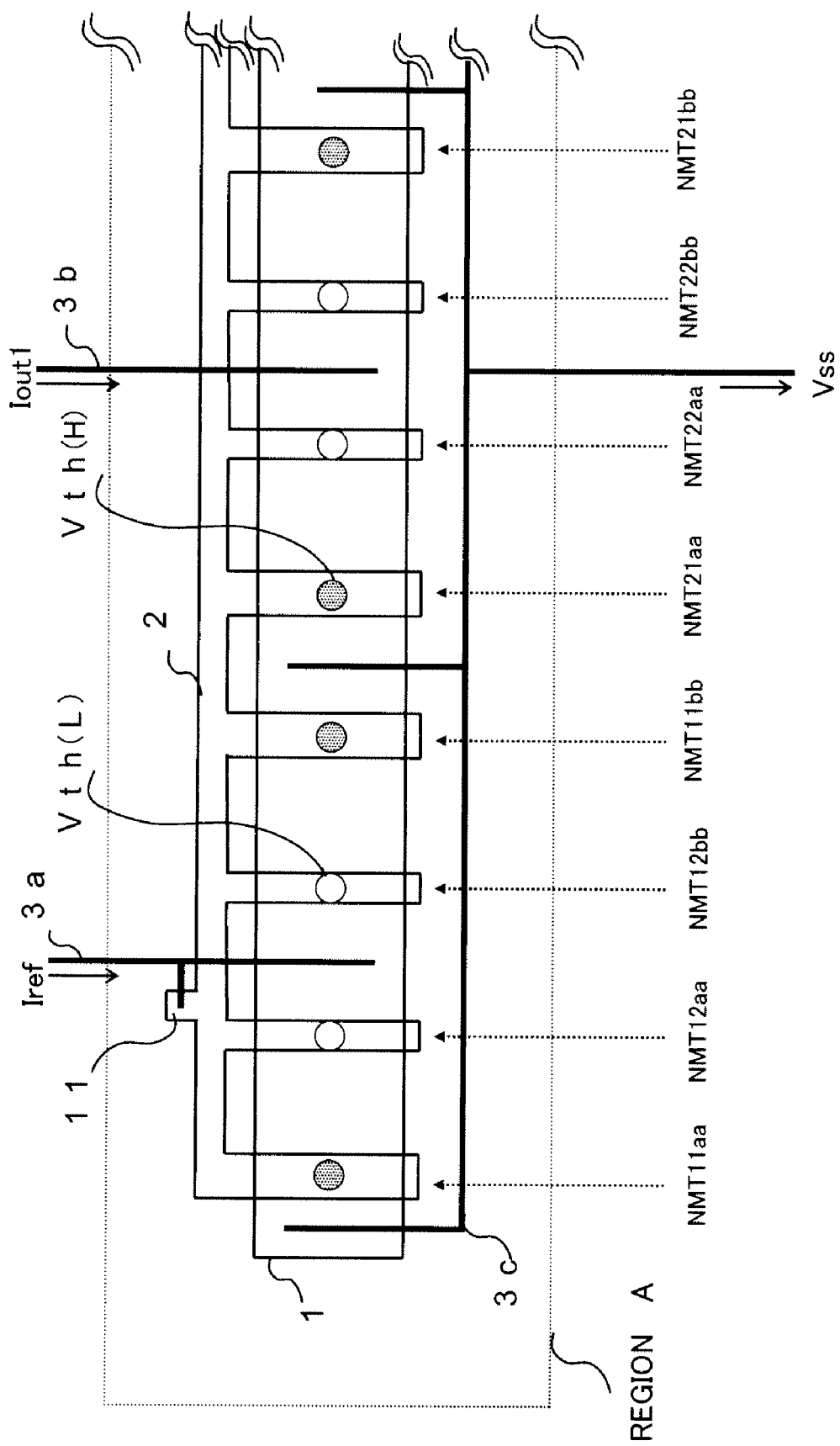
FIG. 3 is a schematic plan view that shows a pattern layout according to a second embodiment of the present invention.

A cascoded circuit according to the second embodiment of the present invention will be described referring to the drawings. FIG. 3 is a schematic plan view that shows a pattern layout of a cascoded current-mirror circuit. In this embodiment, N channel MOS transistors that constitute the cascoded current-mirror circuit that operates in a linear region are formed on the same active region, and the gate length dimensions of the N channel MOS transistors are changed.

As shown in FIG. 3, the N channel MOS transistor NMT11, the N channel MOS transistor NMT12, the N channel MOS transistor NMT21, the N channel MOS transistor NMT22, the N channel MOS transistor NMT31, the N channel MOS transistor NMT32, the N channel MOS transistor NMT41, the N channel MOS transistor NMT42, the N channel MOS transistor NMT51 and the N channel MOS transistor NMT52, that constitute a cascoded current-mirror circuit 50, are arranged and formed on the same active region 1. The gates of these transistors are arranged in parallel with each other, and each gate (gate electrode) has a two-finger structure. The gate electrodes of these transistors are bundled into the same gate electrode and gate wiring (poly gate) 2, and the gate widths of the finger parts are formed into the same dimension. Here, the illustrations and the descriptions of the fingers of the N channel MOS transistor NMT 31 and further will be omitted.

The N channel MOS transistor NMT11 has N channel MOS transistor finger parts NMT11*aa* and NMT11*bb*. The N channel MOS transistor NMT12 has N channel MOS transistor finger parts NMT12*aa* and NMT12*bb*. The N channel MOS transistor NMT21 has N channel MOS transistor finger parts NMT21*aa* and NMT21*bb*. The N channel MOS transistor NMT22 has N channel MOS transistor finger parts NMT22*aa* and NMT22*bb*. The N channel MOS transistor finger parts are arranged in parallel with each other in the X direction of the active region 1.

The N channel MOS transistor finger part NMT 11*aa*, the N channel MOS transistor finger part NMT11*bb*, the N channel MOS transistor finger part NMT21*aa* and the N channel MOS transistor finger part NMT21*bb* have the same threshold voltage Vth 1 and have the same gate length dimension. The N channel MOS transistor finger part NMT12*aa*, the N channel MOS transistor finger part NMT12*bb*, the N channel MOS transistor finger part NMT22*aa* and the N channel MOS transistor finger part NMT22*bb* have the same threshold voltage Vth 2 and have the same gate length dimension, which is smaller than the gate length dimension of the transistors with the threshold voltage Vth 1.

The N channel MOS transistor finger part NMT11 aa is a high threshold transistor Vth (H). The N channel MOS transistor finger part NMT11*aa* is provided at the end of the active region 1, and has a source disposed on the end side of the active region 1. A wiring metal 3*c* connected to the lower voltage source Vss is provided to the source of the N channel MOS transistor finger part NMT11*aa*.

The N channel MOS transistor finger part NMT12*aa* is a low threshold transistor Vth (L). The source of the N channel MOS transistor finger part NMT12*aa* shares the same diffused layer with the drain of the N channel MOS transistor finger part NMT11*aa*. A wiring metal 3*a* connected to the reference current Iref side is provided to the drain of the N channel MOS transistor finger part NMT12*aa*.

The N channel MOS transistor finger part NMT12*bb* is a low threshold transistor Vth (L). The drain of the N channel MOS transistor finger part NMT12*bb* shares the same diffused layer with the drain of the N channel MOS transistor finger part NMT12*aa*. The wiring metal 3*a* connected to the reference current Iref side is connected to the drain of the N channel MOS transistor finger part NMT12*bb*.

The N channel MOS transistor finger part NMT11*bb* is a high threshold transistor Vth (H). The drain of the N channel MOS transistor finger part NMT11*bb* shares the same diffused layer with the source of the N channel MOS transistor finger part NMT12*bb*. The wiring metal 3*c* connected to the lower voltage source Vss is provided to the source of the N channel MOS transistor finger part NMT11*bb*.

The N channel MOS transistor finger part NMT21 aa is a high threshold transistor Vth (H). The source of the N channel MOS transistor finger part NMT21*aa* shares the same diffused layer with the source of the N channel MOS transistor finger part NMT11*bb*. The wiring metal 3*c* connected to the lower voltage source Vss is provided to the source of the N channel MOS transistor finger part NMT21 aa.

The N channel MOS transistor finger part NMT22*aa* is a low threshold transistor Vth (L). The source of the N channel MOS transistor finger part NMT22*aa* shares the same diffused layer with the drain of the N channel MOS transistor finger part NMT21*aa*. A wiring metal 3*b* connected to the output current Iout 1 side is provided to the drain of the N channel MOS transistor finger part NMT22*aa*.

The N channel MOS transistor finger part NMT22*bb* is a low threshold transistor Vth (L). The drain of the N channel MOS transistor finger part NMT22*bb* shares the same diffused layer with the drain of the N channel MOS transistor finger part NMT22*aa*. The wiring metal 3*b* connected to the output current Iout 1 side is provided to the drain of the N channel MOS transistor finger part NMT22*bb*.

The N channel MOS transistor finger part NMT21 bb is a high threshold transistor Vth (H). The drain of the N channel MOS transistor finger part NMT21*bb* shares the same diffused layer with the source of the N channel MOS transistor finger part NMT22*bb*. The wiring metal 3*c* connected to the lower voltage source Vss is provided to the source of the N channel MOS transistor finger part NMT21 bb.

The N channel MOS transistor finger parts NMT11*aa*, NMT11*bb*, NMT12*aa*, NMT12*bb*, NMT21*aa*, NMT21*bb*, NMT22*aa* and NMT22*bb* are bundled together outside the active region 1 and connected to the wiring metal 3*a* connected to the reference current Iref side through the connection part 11. Here, the mirror ratio of the cascoded current-mirror circuit 50 is set at one. When the mirror ratio is changed, this change can be coped with by altering the dimension in the transverse direction of the active region 1 and by appropriately inserting a transistor finger part. In this case, the location of the source or the drain does not need to be considered.

On the other hand, when the N channel MOS transistor NMT11, the N channel MOS transistor NMT21, the N channel MOS transistor NMT31, the N channel MOS transistor NMT41 and the N channel MOS transistor NMT51, which have the same threshold voltage Vth 1, and the N channel MOS transistor NMT12, the N channel MOS transistor NMT22, the N channel MOS transistor NMT32, the N channel MOS transistor NMT42 and N channel MOS transistor NMT52, which have the same threshold voltage Vth 2, are provided in separate active regions, the order of the sources or the drains needs to be matched. In particular, when the number of the fingers is an odd number, a finger for adjustment needs to be inserted.

As a result, in this embodiment, the area of the pattern layout can be reduced as compared with the case where transistors are provided in separate active regions. In addition, when transistors constituting a cascoded current-mirror circuit are provided in separate active regions, the characteristics of the transistors, such as a threshold voltage, are varied by being influenced by the stress from the STI and the like forming the device isolation region. In particular, the difference in the dimensions of the separate active regions in the width direction of the gates of the transistors makes the situation more remarkable. On the other hand, this embodiment can suppress the influence of the stress and reduce the variation of characteristics of the transistors even if the transistors with different gate length dimensions are provided.

As described above, the cascoded circuit of this embodiment is provided with the N channel MOS transistors NMT11, NMT12, NMT21, NMT22, NMT31, NMT32, NMT41, NMT42, NMT51 and NMT52. The MOS transistor NMT12, the N channel MOS transistor NMT22, the N channel MOS transistor NMT32, the N channel MOS transistor NMT42 and the N channel MOS transistor NMT52 are respectively cascode-connected to the MOS transistor NMT11, the N channel MOS transistor NMT21, the N channel MOS transistor NMT31, the N channel MOS transistor NMT41 and the N channel MOS transistor NMT51. The drain of the N channel MOS transistor NMT12 is connected to the gates of the N channel MOS transistors NMT11, NMT12, NMT21, NMT22, NMT31, NMT32, NMT41, NMT42, NMT51 and NMT52. The cascoded current-mirror circuit 50 operates in a linear region. The threshold voltages of the N channel MOS transistors NMT11, NMT21, NMT31, NMT41 and NMT51, which are provided on the lower voltage source Vss side, is set larger than the threshold voltages of the N channel MOS transistors NMT12, NMT22, NMT32, NMT42 and NMT52. The gates of the N channel MOS transistors NMT11, NMT12, NMT21, NMT22, NMT31, NMT32, NMT41, NMT42, NMT51 and NMT52 are arranged in the active region 1 to be in parallel with each other. The gate length dimension of the N channel MOS transistors NMT11, NMT21, NMT31, NMT41 and NMT51 is made larger than the gate length dimension of the N channel MOS transistors NMT12, NMT22, NMT32, NMT42 and NMT52.

Therefore, the power supply voltage margin of the cascoded current-mirror circuit 50 can be enlarged as compared with the case where the threshold voltages of the N channel MOS transistors are identical. Thereby, the cascoded current-mirror circuit 50 can operate at a low voltage. Moreover, the power supply voltage margin of the cascoded circuit can be made larger than that of a cascoded current-mirror circuit in which a current-mirror circuit is configured of two stages and operates in a saturation region. Thereby, the cascoded current-mirror circuit 50 can operate at a low voltage. Furthermore, the area of the pattern layout of the cascoded current-mirror circuit 50 can be reduced as compared with the case where N channel MOS transistors constituting a cascoded current-mirror circuit are provided in separate active regions. The variation of characteristics of the transistors can be decreased.

Additionally, in this embodiment, the gate length dimensions of the transistors on the lower voltage source Vss side are made larger than the gate length dimensions of the cascode-connected transistors of the upper stage so as to enlarge the absolute value of the threshold voltage. Alternatively, while making constant the gate length dimensions, the gate width dimension (the width of the active region 1) of the cascode-connected transistors of the upper stage may be made larger than the gate width dimension (the width of the active region 1) of the transistors on the lower voltage source Vss side. In that case, the absolute value of the threshold voltage of the transistors on the lower voltage source Vss side can be made larger than the absolute value of the threshold voltage of the cascode-connected transistors of the upper stage.

Figure 4:
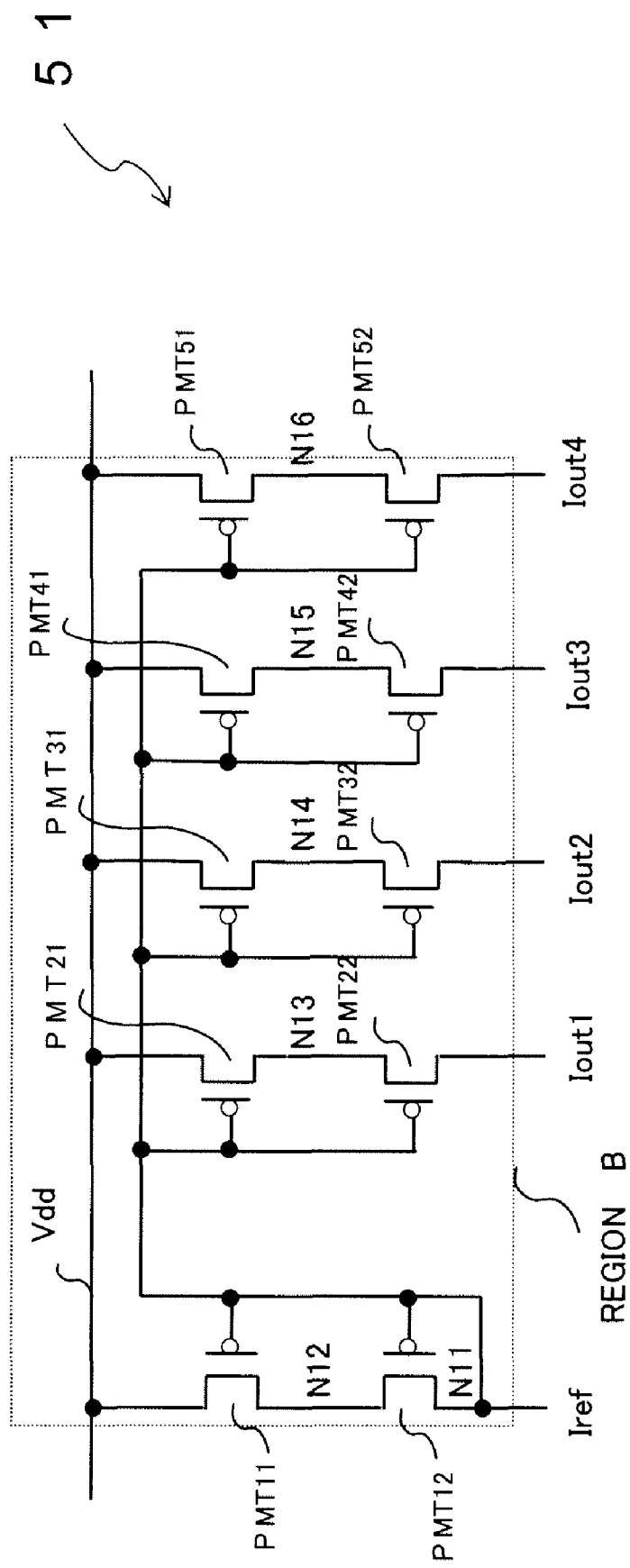
FIG. 4 is a circuit diagram that shows a cascoded current-mirror circuit according to a third embodiment of the present invention.

A cascoded circuit according to the third embodiment of the present invention will be described referring to the drawings. FIG. 4 is a circuit diagram that shows a cascoded current-mirror circuit. In this Embodiment, P channel MOS transistors that constitute a cascoded current-mirror circuit that operates in a linear region is formed in the same active region.

As shown in FIG. 4, a cascoded current-mirror circuit 51 includes a P channel MOS transistor PMT11, a P channel MOS transistor PMT12, a P channel MOS transistor PMT21, a P channel MOS transistor PMT22, a P channel MOS transistor PMT31, a P channel MOS transistor PMT32, a P channel MOS transistor PMT41, a P channel MOS transistor PMT42, a P channel MOS transistor PMT51 and a P channel MOS transistor PMT52.

Here, the P channel MOS transistor PMT11, the P channel MOS transistor PMT12, the P channel MOS transistor PMT21, the P channel MOS transistor PMT22, the P channel MOS transistor PMT31, the P channel MOS transistor PMT32, the P channel MOS transistor PMT41, the P channel MOS transistor PMT42, the P channel MOS transistor PMT51 and the P channel MOS transistor PMT52 are provided within a region B in the figure. These transistors are E type (enhancement type) transistors (also called the normally-off type transistors). In the E type transistor, the transistor is turned off when a voltage is not supplied to the gate, and the transistor is turned on when a voltage is supplied to the gate.

In the cascoded current-mirror circuit 51, the P channel MOS transistors are cascode-connected between the higher voltage source Vdd side and a node N11 (the lower voltage source Vss side). The gates of the P channel MOS transistors are all connected to the node N11 located on the reference current Iref side. The cascoded current-mirror circuit 51 can provide higher output impedance than a current-mirror circuit configured of one stage. Thereby, the property fluctuation caused by the power supply voltage variation can be reduced.

A source of the P channel MOS transistor PMT11 is connected to the higher voltage source Vdd. A gate of the P channel MOS transistor PMT11 is connected to the node N11. A drain of the P channel MOS transistor PMT11 is connected to the node N12. The P channel MOS transistor PMT12 is disposed on the lower voltage source side. A source of the P channel MOS transistor PMT12 is connected to the node N12. A gate of the P channel MOS transistor PMT12 is connected to the node N11. A drain of the P channel MOS transistor PMT12 is connected to the node N11. The P channel MOS transistor PMT11 and the P channel MOS transistor PMT12 flow the reference current Iref from the higher voltage source Vdd side to the node N11 side.

A source of the P channel MOS transistor PMT21 is connected to the higher voltage source Vdd. A gate of the P channel MOS transistor PMT21 is connected to the node N11. A drain of the P channel MOS transistor PMT21 is connected to the node N13. The P channel MOS transistor PMT22 is disposed on the lower voltage source side. A source of the P channel MOS transistor PMT22 is connected to the node N13. A gate of the P channel MOS transistor PMT22 is connected to the node N11. A drain of the P channel MOS transistor PMT22 is connected to an output current Iout 1 side.

The P channel MOS transistor PMT11, the P channel MOS transistor PMT12, the P channel MOS transistor PMT21 and the P channel MOS transistor PMT22 constitute a current-mirror circuit. The P channel MOS transistor PMT21 and the P channel MOS transistor PMT22 flow the output current Iout 1, which is obtained by multiplying the reference current by the mirror ratio, from the higher voltage source Vdd side to the drain side of the P channel MOS transistor PMT22.

A source of the P channel MOS transistor PMT31 is connected to the higher voltage source Vdd. A gate of the P channel MOS transistor PMT31 is connected to the node N11. A drain of the P channel MOS transistor PMT31 is connected to the node N14. The P channel MOS transistor PMT32 is disposed on the lower voltage source side. A source of the P channel MOS transistor PMT32 is connected to the node N14. A gate of the P channel MOS transistor PMT32 is connected to the node N11. A drain of the P channel MOS transistor PMT32 is connected to an output current Iout 2 side.

The P channel MOS transistor PMT11 and the P channel MOS transistor PMT12, and the P channel MOS transistor PMT31 and the P channel MOS transistor PMT32 constitute a current-mirror circuit. The P channel MOS transistor PMT31 and the P channel MOS transistor PMT32 flow the output current Iout 2, which is obtained by multiplying the reference current by the mirror ratio, from the higher voltage source Vdd side to the drain side of the P channel MOS transistor PMT32.

A source of the P channel MOS transistor PMT41 is connected to the higher voltage source Vdd. A gate of the P channel MOS transistor PMT41 is connected to the node N11. A drain of the P channel MOS transistor PMT41 is connected to the node N15. The P channel MOS transistor PMT42 is disposed on the lower voltage source side. A source of the P channel MOS transistor PMT42 is connected to the node N15. A gate of the P channel MOS transistor PMT42 is connected to the node N11. A drain of the P channel MOS transistor PMT42 is connected to an output current Iout 3 side.

The P channel MOS transistor PMT11, the P channel MOS transistor PMT12, the P channel MOS transistor PMT41 and the P channel MOS transistor PMT42 constitute a current-mirror circuit. The P channel MOS transistor PMT41 and the P channel MOS transistor PMT42 flow the output current Iout 3, which is obtained by multiplying the reference current by the mirror ratio, from the higher voltage source Vdd side to the drain side of the P channel MOS transistor PMT42.

A source of the P channel MOS transistor PMT51 is connected to the higher voltage source Vdd. A gate of the P channel MOS transistor PMT51 is connected to the node N11. A drain of the P channel MOS transistor PMT51 is connected to the node N16. The P channel MOS transistor PMT52 is disposed on the lower voltage source side. A source of the P channel MOS transistor PMT52 is connected to the node N16. A gate of the P channel MOS transistor PMT52 is connected to the node N11. A drain of the P channel MOS transistor PMT52 is connected to an output current Iout 4 side.

The P channel MOS transistor PMT11, the P channel MOS transistor PMT12, the P channel MOS transistor PMT51 and the P channel MOS transistor PMT52 constitute a current-mirror circuit. The P channel MOS transistor PMT51 and the P channel MOS transistor PMT52 flow the output current Iout 4, which is obtained by multiplying the reference current by the mirror ratio, from the higher voltage source Vdd side to the drain side of the P channel MOS transistor PMT52.

The cascoded current-mirror circuit 51 differs from a cascoded current-mirror circuit in which a current-mirror circuit is configured of two stages and operates in a saturation region. The gate of the P channel MOS transistor PMT11 on the higher voltage source Vdd side is not connected to a drain. Thereby, the voltages between the gates and the sources of the P channel MOS transistor PMT21, the P channel MOS transistor PMT31, the P channel MOS transistor PMT41 and the P channel MOS transistor PMT51, each on the higher voltage source Vdd side, can be made equal to their voltages between the sources and the drains. As a result, the P channel MOS transistor PMT11, the P channel MOS transistor PMT21, the P channel MOS transistor PMT31, the P channel MOS transistor PMT41 and the P channel MOS transistor PMT51 can operate in a linear region.

The P channel MOS transistor PMT11, the P channel MOS transistor PMT21, the P channel MOS transistor PMT31, the P channel MOS transistor PMT41 and the P channel MOS transistor PMT51 are set, for example, at the same threshold voltage Vth 3. The P channel MOS transistor PMT12, the P channel MOS transistor PMT22, the P channel MOS transistor PMT32, the P channel MOS transistor PMT42 and the P channel MOS transistor PMT52 are set, for example, at the same threshold voltage Vth 4.

The threshold voltage Vth 3 and the threshold voltage Vth 4 are set as the following formula.

$$|Vth3| > |Vth4| \qquad \text{Formula (2)}$$

|Vth 3| and |Vth 4| are absolute values of the threshold voltages. For instance, the threshold voltage Vth 3 is set at −500 mV, and the threshold voltage Vth 4 is set at −200 mV.

When the voltages are set as in Formula (2), the voltages (voltages between the sources and the drains) applied to the P channel MOS transistor PMT12, the P channel MOS transistor PMT22, the P channel MOS transistor PMT32, the P channel MOS transistor PMT42 and the P channel MOS transistor PMT52 can be made smaller than the voltages (voltages between the sources and the drains) applied to the P channel MOS transistor PMT11, the P channel MOS transistor PMT21, the P channel MOS transistor PMT31, the P channel MOS transistor PMT41 and the P channel MOS transistor PMT51.

By the linear region operation and by the setting of two kinds of threshold voltages, the power supply voltage margin of the cascoded current-mirror circuit 51 can be made larger than that of a cascoded current-mirror circuit in which a current-mirror circuit is configured of two stages and operates in a saturation region. Thus, the cascoded current-mirror circuit 51 can operate at a low voltage. In addition, for the purpose of making the voltage of the node N13, the node N14, the node N15 and the node N16 equal to the voltage of the node N12, voltage correction means (a comparator, for example) may be disposed between the node N12 and the node N13, between the node N12 and the node N14, between the node N12 and the node N15, and between the node N12 and the node N16. By providing the voltage correction, the output currents Iout 1 to Iout 4 can be made constant further to the low voltage region.

Figure 5:
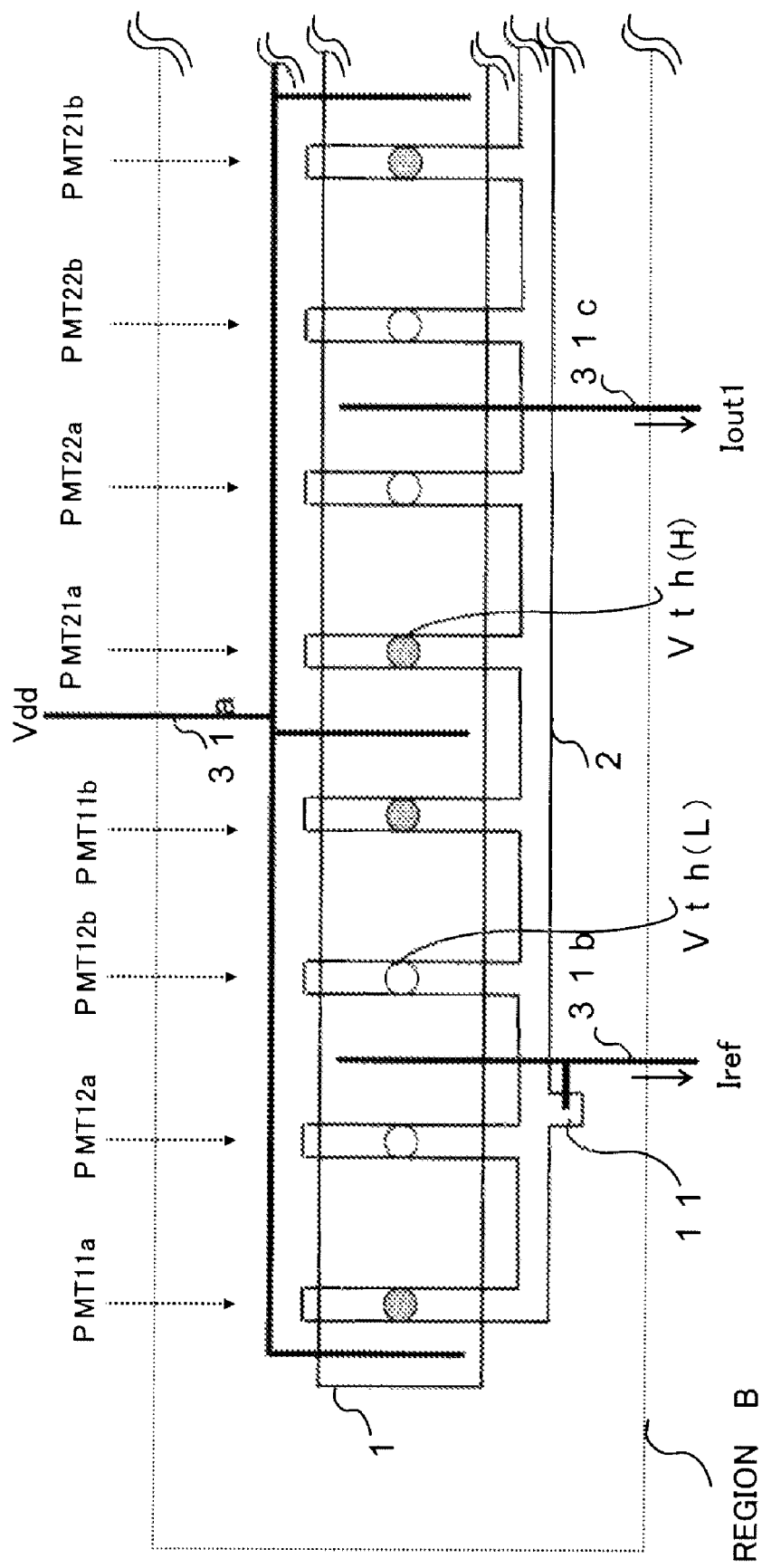
FIG. 5 is a schematic plan view that shows a pattern layout of a region B of FIG. 4.

A pattern arrangement method of a cascoded current-mirror circuit will be described referring to FIG. 5. FIG. 5 is a schematic plan view that shows a pattern layout of the region B of FIG. 4.

As shown in FIG. 5, the P channel MOS transistor PMT11, the P channel MOS transistor PMT12, the P channel MOS transistor PMT21, the P channel MOS transistor PMT22, the P channel MOS transistor PMT31, the P channel MOS transistor PMT32, the P channel MOS transistor PMT41, the P channel MOS transistor PMT42, the P channel MOS transistor PMT51 and the P channel MOS transistor PMT52 are provided in the same active region 1. The gates of these transistors are arranged to be parallel with each other, and each gate (gate electrode) has a two-finger structure. The gate electrodes of these transistors are bundled into the same gate electrode/gate wiring 2. The gate lengths of the finger parts are formed into the same size, and the gate widths of the finger parts are formed into the same size. Here, the illustrations and the descriptions of the finger parts of the P channel MOS transistor PMT31 and further will be omitted.

The P channel MOS transistor PMT11 has P channel MOS transistor finger parts PMT11a and PMT11b. The P channel MOS transistor PMT12 has P channel MOS transistor finger parts PMT12a and PMT12b. The P channel MOS transistor PMT21 has P channel MOS transistor finger parts PMT21a and PMT21b. The P channel MOS transistor PMT22 has P channel MOS transistor finger parts PMT22a and PMT22b. The P channel MOS transistor finger parts are arranged in parallel with each other in the X direction of the active region 1.

The P channel MOS transistor finger part PMT11a is a high threshold transistor Vth (H). The P channel MOS transistor finger part PMT11a is provided at the end of the active region 1, and has a source disposed on the end side of the active region 1. A wiring metal 31a connected to the higher voltage source Vdd is provided to the source of the P channel MOS transistor finger part PMT11a.

The P channel MOS transistor finger part PMT12a is a low threshold transistor Vth (L). The source of the P channel MOS transistor finger part PMT12a shares the same diffused layer with the drain of the P channel MOS transistor finger part PMT11a. A wiring metal 31b connected to the reference current Iref side is provided to the drain of the P channel MOS transistor finger part PMT12a. The high threshold transistor Vth (H) and the low threshold transistor Vth (L) can be formed by, for example, changing the channel ion implantation conditions (such as a channel dosage) for threshold voltage adjustment.

The P channel MOS transistor finger part PMT12b is a low threshold transistor Vth (L). The drain of the P channel MOS transistor finger part PMT12b shares the same diffused layer with the drain of the P channel MOS transistor finger part PMT12a. The wiring metal 31b connected to the reference current Iref side is provided to the drain of the P channel MOS transistor finger part PMT12b.

The P channel MOS transistor finger part PMT11b is a high threshold transistor Vth (H). The drain of the P channel MOS transistor finger part PMT11b shares the same diffused layer with the source of the P channel MOS transistor finger part PMT12b. The wiring metal 31a connected to the higher voltage source Vdd is provided to the source of the P channel MOS transistor finger part PMT11b.

The P channel MOS transistor finger part PMT21a is a high threshold transistor Vth (H). The source of the P channel MOS transistor finger part PMT21a shares the same diffused layer with the source of the P channel MOS transistor finger part PMT11b. The wiring metal 31a connected to the higher voltage source Vdd is provided to the source of the P channel MOS transistor finger part PMT21a.

The P channel MOS transistor finger part PMT22a is a low threshold transistor Vth (L). The source of the P channel MOS transistor finger part PMT22a shares the same diffused layer with the drain of the P channel MOS transistor finger part PMT21a. A wiring metal 31c connected to the output current Iout 1 side is provided to the drain of the P channel MOS transistor finger part PMT22a.

The P channel MOS transistor finger part PMT22b is a low threshold transistor Vth (L). The drain of the P channel MOS transistor finger part PMT22b shares the same diffused layer with the drain of the P channel MOS transistor finger part PMT22a. The wiring metal 31c connected to the output current Iout 1 side is provided to the drain of the P channel MOS transistor finger part PMT22b.

The P channel MOS transistor finger part PMT21b is a high threshold transistor Vth (H). The drain of the P channel MOS transistor finger part PMT21b shares the same diffused layer with the source of the P channel MOS transistor finger part PMT22b. The wiring metal 31a connected to the higher voltage source Vdd is provided to the source of the P channel MOS transistor finger part PMT21b.

The P channel MOS transistor finger parts PMT11a, PMT11b, PMT12a, PMT12b, PMT21a, PMT21b, PMT22a and PMT22b are bundled together outside the active region 1 and connected to the wiring metal 31b connected to the reference current Iref side through the connection part 11.

Here, the mirror ratio of the cascoded current-mirror circuit 51 is set at one. When the mirror ratio is changed, this change can be coped with by altering the dimension in the transverse direction of the active region 1 and by appropriately inserting a transistor finger part. In this case, the arrangement of the source or the drain does not need to be considered.

On the other hand, when the P channel MOS transistor PMT11, the P channel MOS transistor PMT21, the P channel MOS transistor PMT31, the P channel MOS transistor PMT41 and the P channel MOS transistor PMT51, which have the same threshold voltage Vth 3, and the P channel MOS transistor PMT12, the P channel MOS transistor PMT22, the P channel MOS transistor PMT32, the P channel MOS transistor PMT42 and P channel MOS transistor PMT52, which have the same threshold voltage Vth 4, are provided in separate active regions, the order of the sources or the drains needs to be matched. In particular, when the number of the fingers is an odd number, a finger for adjustment needs to be inserted.

As a result, in this embodiment, the area of the pattern layout can be reduced as compared with the case where transistors are provided in separate active regions. In addition, when transistors constituting a cascoded current-mirror circuit is provided in separate active regions, the characteristics of the transistors, such as a threshold voltage, are varied by being influenced by the stress from the STI and the like forming the device isolation region. In particular, the difference in the dimensions of the separate active regions in the width direction of the gates of the transistors makes the situation more remarkable. On the other hand, this embodiment can suppress the stress and reduce the variation of characteristics of the transistors.

As described above, the cascoded circuit of this embodiment is provided with the P channel MOS transistors PMT11, PMT12, PMT21, PMT22, PMT31, PMT32, PMT41, PMT42, PMT51 and PMT52. The P channel MOS transistor PMT11, the P channel MOS transistor PMT21, the P channel MOS transistor PMT31, the P channel MOS transistor PMT41 and the P channel MOS transistor PMT51 are respectively cascode-connected to the P channel MOS transistor PMT12, the P channel MOS transistor PMT22, the P channel MOS transistor PMT32, the P channel MOS transistor PMT41 and the P channel MOS transistor PMT52. The drain of the P channel MOS transistor PMT12 is connected to the gates of the P channel MOS transistors PMT11, PMT12, PMT21, PMT22, PMT31, PMT32, PMT41, PMT42, PMT51 and PMT52. The cascoded current-mirror circuit 51 operates in a linear region. The absolute value of the threshold voltage of the P channel MOS transistors PMT11, PMT21, PMT31, PMT41 and PMT51, which are disposed on the higher voltage source Vdd side, is set to be larger than the absolute value of the threshold voltage of the P channel MOS transistors PMT12, PMT22, PMT32, PMT42 and PMT52. The gates of the P channel MOS transistors PMT11, PMT12, PM21, PMT22, PMT31, PMT32, PMT41, PMT42, PMT51 and PMT52 are arranged in the active region 1 in parallel with each other.

Therefore, the cascoded current-mirror circuit 51 having cascode-connected P channel MOS transistors also provides advantages similar to the first embodiment.

In addition, in this embodiment, transistors having different threshold voltages are formed by changing the channel ion implantation conditions for threshold voltage adjustment (such as a channel dosage). Transistors having different threshold voltages may be formed by changing the gate length dimensions or the gate width dimensions.

Figure 6:
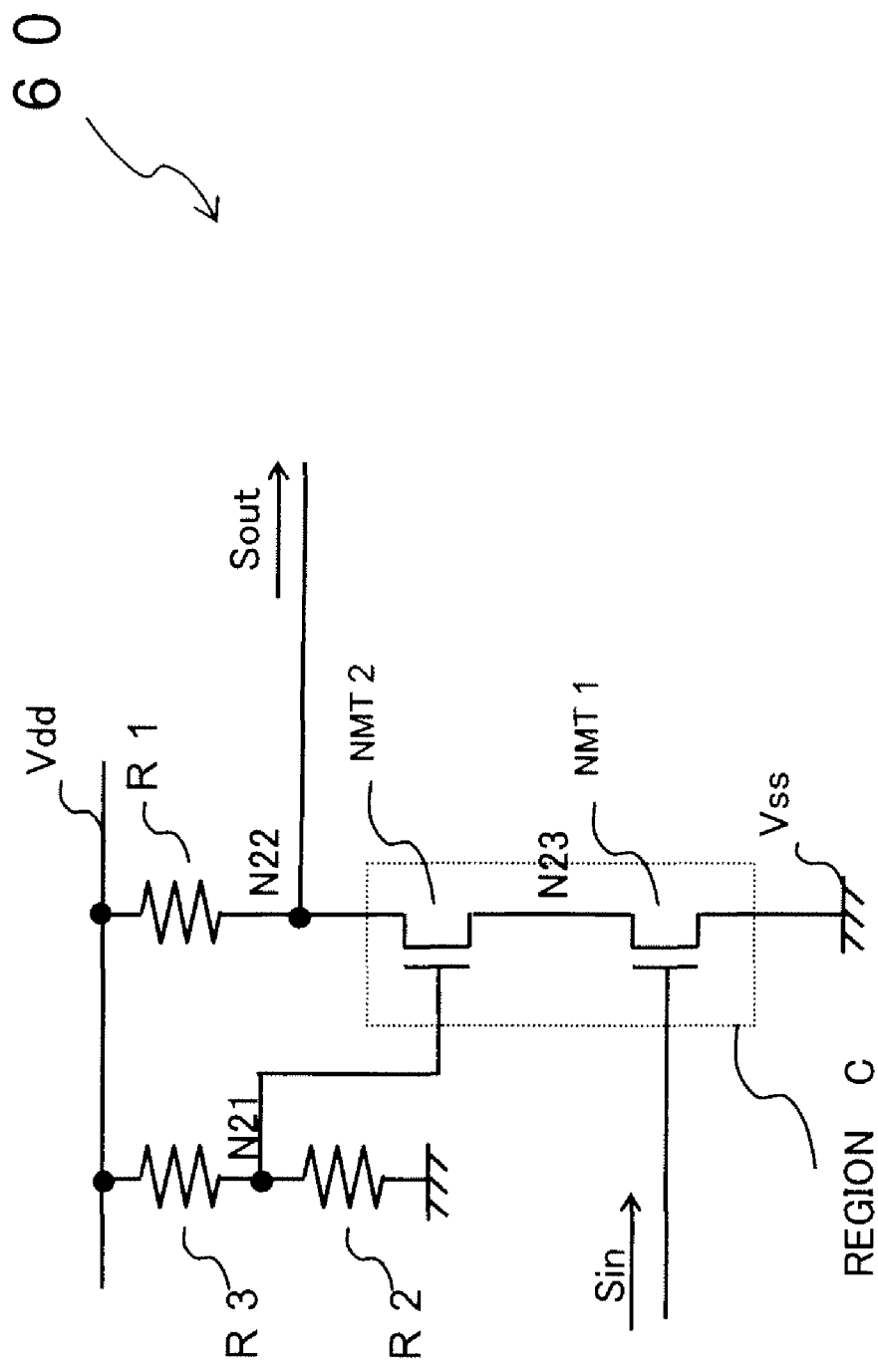
FIG. 6 is a circuit diagram that shows a cascoded amplifier according to a fourth embodiment of the present invention.

A cascoded circuit according to the fourth embodiment of the present invention will be described referring to the drawings. FIG. 6 is a circuit diagram that shows a cascoded amplifier. In this embodiment, N channel MOS transistors of the cascoded amplifier are formed in the same active region.

As shown in FIG. 6, a cascoded amplifier 60 is provided with an N channel MOS transistor NMT1, an N channel MOS transistor NMT2, a resistance R1, a resistance R2 and a resistance R3. Here, the N channel MOS transistor NMT1 and the N channel MOS transistor NMT2 are disposed in a region C in the figure, and are E type (enhancement type) transistors (also called normally-off type transistors). The N channel MOS transistor NMT1 and the N channel MOS transistor NMT2 are turned off when a voltage is not supplied to their gates, and are turned on when a voltage is supplied to their gates. The cascoded amplifier 60 can provide high output impedance as compared to a one-stage amplifier. Thereby, the property fluctuation caused by the power supply voltage variation can be reduced, and the feedback from the output side to the input side can be decreased. Therefore, the cascoded amplifier has excellent high-frequency properties.

The one end of the resistance R3 is connected to the higher voltage source Vdd. The other end of the resistance R3 is connected to the node N21. The one end of the resistance R2 is connected to the node N21. The other end of the resistance R2 is connected to the lower voltage source Vss. Here, the lower voltage source Vss is a ground voltage. A voltage obtained by resistance-dividing the higher voltage source Vdd is generated from the node N21.

The one end of the resistance R1 is connected to the higher voltage source Vdd. The other end of the resistance R1 is connected to the node N22. A drain of the N channel MOS transistor NMT2 is connected to the node N22. A source of the N channel MOS transistor NMT2 is connected to the node N23. A gate of the N channel MOS transistor NMT2 is connected to the node N21. The N channel MOS transistor NMT2 is turned on when the voltage obtained by resistance-dividing the higher voltage source Vdd is input into the gate of the N channel MOS transistor NMT2. A drain of the N channel MOS transistor NMT1 is connected to the node N23. A source of the N channel MOS transistor NMT1 is connected to the lower voltage source Vss. An input signal Sin is input to the gate of the N channel MOS transistor NMT1. An output signal Sout is output from the node N22.

The N channel MOS transistor NMT1 is set, for example, at a threshold voltage Vth 5. The N channel MOS transistor NMT2 is set, for example, at a threshold voltage Vth 6. The threshold voltage Vth 5 and the threshold voltage Vth 6 are set as the following formula.

$$Vth5 > Vth6 \quad \text{Formula (3)}$$

When the voltages are set as in Formula (3), the voltage (voltage between the drain and the source) applied to the N channel MOS transistor NMT2 can be made smaller than the voltage (voltage between the drain and the source) applied to the N channel MOS transistor NMT1. By the setting of two kinds of threshold voltages, the power supply voltage margin of the cascoded amplifier 60 can be made larger than that of a cascoded amplifier with one kind of threshold voltage. Thereby, the cascoded amplifier 60 can operate at a low voltage.

Figure 7:
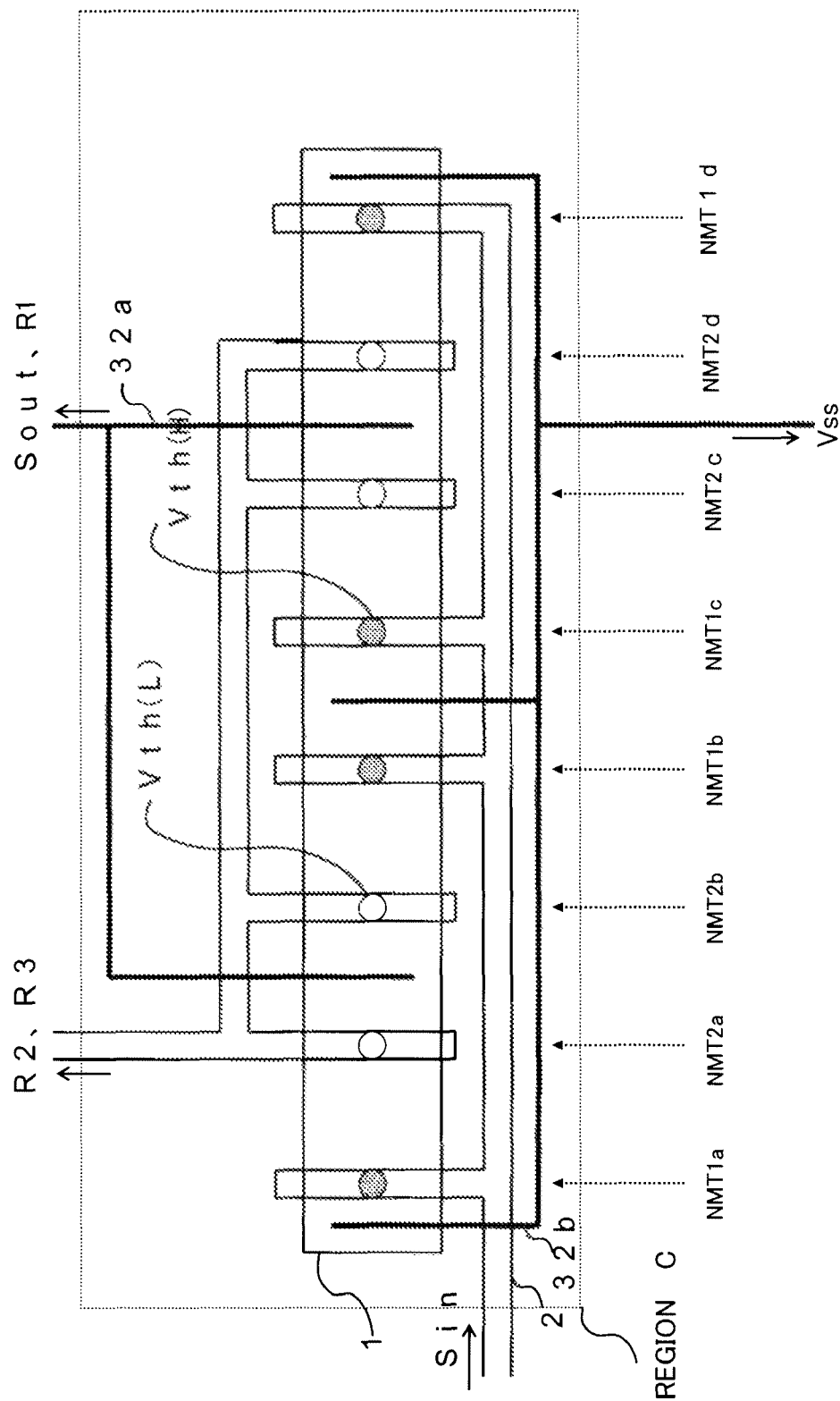
FIG. 7 is a schematic plan view that shows a pattern layout of a region C of FIG. 6.

A pattern arrangement method of a cascoded amplifier will be described referring to FIG. 7. FIG. 7 is a schematic plan view that shows a pattern layout of the region C of FIG. 6.

As shown in FIG. 7, the N channel MOS transistor NMT1 and the N channel MOS transistor NMT2 are provided in the same active region 1, and each gate (gate electrode) has a four-finger structure. The gate electrodes of the N channel MOS transistor NMT1 is bundled into the same gate electrode/gate wiring 2 (input signal Sin side). The gate electrodes of the N channel MOS transistor NMT2 is bundled into the same gate electrode/gate wiring 2 (resistance R2 and resistance R3 side). The gate lengths of the finger parts of the N channel MOS transistor NMT1 and the N channel MOS transistor NMT2 are formed into to the same dimension, and the gate widths of the finger parts of the N channel MOS transistor NMT1 and the N channel MOS transistor NMT2 are formed into to the same dimension. The gates of the N channel MOS transistors NMT1 and NMT2 are arranged in parallel with each other.

The N channel MOS transistor NMT1 has N channel MOS transistor finger parts NMT1*a* to NMT1*d*. The N channel MOS transistor NMT2 has N channel MOS transistor finger parts NMT2*a* to NMT2*d*. N channel MOS transistor finger parts are arranged in parallel with each other in the X direction of the active region 1.

The N channel MOS transistor finger part NMT1*a* is a high threshold transistor Vth (H). The N channel MOS transistor finger part NMT1*a* is provided at the end of the active region 1, and has a source disposed on the end side of the active region 1. A wiring metal 32*b* connected to the lower voltage source Vss is provided to the source of the N channel MOS transistor finger part NMT1*a*.

The N channel MOS transistor finger part NMT2*a* is a low threshold transistor Vth (L). The source of the N channel MOS transistor finger part NMT2*a* shares the same diffused layer with the drain of the N channel MOS transistor finger part NMT1*a*. A wiring metal 32*a* connected to the node 22 side is provided to the drain of the N channel MOS transistor finger part NMT2*a*. The high threshold transistor Vth (H) and the low threshold transistor Vth (L) can be formed by, for example, changing the channel ion implantation conditions for threshold voltage adjustment (such as a channel dosage).

The N channel MOS transistor finger part NMT2*b* is a low threshold transistor Vth (L). The drain of the N channel MOS transistor finger part NMT2*b* shares the same diffused layer with the drain of the N channel MOS transistor finger part NMT2*a*. The wiring metal 32*a* connected to the node N22 side is provided to the drain of the N channel MOS transistor finger part NMT2*b*.

The N channel MOS transistor finger part NMT1*b* is a high threshold transistor Vth (H). The drain of the N channel MOS transistor finger part NMT1*b* shares the same diffused layer with the source of the N channel MOS transistor finger part NMT2*b*. The wiring metal 32*b* connected to the lower voltage source Vss is provided to the source of the N channel MOS transistor finger part NMT1*b*.

The N channel MOS transistor finger part NMT1*c* is a high threshold transistor Vth (H). The source of the N channel MOS transistor finger part NMT1*c* shares the same diffused layer with the source of the N channel MOS transistor finger part NMT1*b*. The wiring metal 32*b* connected to the lower voltage source Vss is provided to the source of the N channel MOS transistor finger part NMT1*c*.

The N channel MOS transistor finger part NMT2*c* is a low threshold transistor Vth (L). The source of the N channel MOS transistor finger part NMT2*c* shares the same diffused layer with the drain of the N channel MOS transistor finger part NMT1*c*. The wiring metal 32*a* connected to the node N22 side is connected to the drain of the N channel MOS transistor finger part NMT2*c*.

The N channel MOS transistor finger part NMT2*d* is a low threshold transistor Vth (L). The drain of the N channel MOS transistor finger part NMT2*d* shares the same diffused layer with the drain of the N channel MOS transistor finger part NMT2*c*. The wiring metal 32*a* connected to the node N22 side is provided to the drain of the N channel MOS transistor finger part NMT2*d*.

The N channel MOS transistor finger part NMT1*d* is a high threshold transistor Vth (H). The drain of the N channel MOS transistor finger part NMT1*d* shares the same diffused layer with the source of the N channel MOS transistor finger part NMT2d. The wiring metal 32b connected to the lower voltage source Vss is provided to the source of the N channel MOS transistor finger part NMT1d. The N channel MOS transistor finger parts NMT1a to NMT1d and the N channel MOS transistor finger parts NMT2a to NMT2d are arranged in parallel with each other. Here, the arrangement of the sources or the drains does not need to be considered even when the number of the fingers is odd or even.

On the other hand, when the N channel MOS transistor NMT1 having the threshold voltage Vth 5 and the N channel MOS transistor NMT2 having the threshold voltage Vth 6 are provided in separate active regions, the order of the sources or the drains needs to be matched.

As a result, in this embodiment, the area of the pattern layout can be reduced as compared with the case where transistors are provided in separate active regions. In addition, when transistors constituting a cascoded amplifier are provided in separate active regions, the characteristics of the transistors, such as a threshold voltage, are varied by being influenced by the stress from the STI and the like forming the device isolation region. In particular, the difference in the dimensions of the separate active regions in the width direction of the gates of the transistors makes the situation more remarkable. On the other hand, this embodiment can suppress the stress and reduce the variation of characteristics of the transistors.

As described above, the cascoded amplifier of this embodiment is provided with the N channel MOS transistor NMT1, the N channel MOS transistor NMT2, the resistance R1, the resistance R2 and the resistance R3. The N channel MOS transistor NMT2 having the gate to which a voltage is applied is cascode-connected to the N channel MOS transistor NMT1 having the gate to which the input signal Sin is input. The threshold voltage of the N channel MOS transistor NMT1 disposed on the lower voltage source Vss side is set larger than the threshold voltage of the N channel MOS transistor NMT2. The gates of the N channel MOS transistor NMT1 and the N channel MOS transistor NMT2 are arranged in the active region 1 in parallel with each other.

Therefore, the power supply voltage margin of the cascoded amplifier 60 can be enlarged as compared with the case where the threshold voltages of the N channel MOS transistors are identical. Thereby, the cascoded amplifier 60 can operate at a low voltage. Furthermore, the area of the pattern layout of the cascoded amplifier can be reduced as compared with the case where N channel MOS transistors constituting a cascoded amplifier are arranged in separate active regions. The variation of characteristics of the transistors can be decreased.

In addition, although the pattern arrangement method is applied to a cascoded amplifiers having cascode-connected N channel MOS transistors in this embodiment, the method is also applicable to a cascoded amplifier having cascode-connected P channel MOS transistors.

Figure 8:
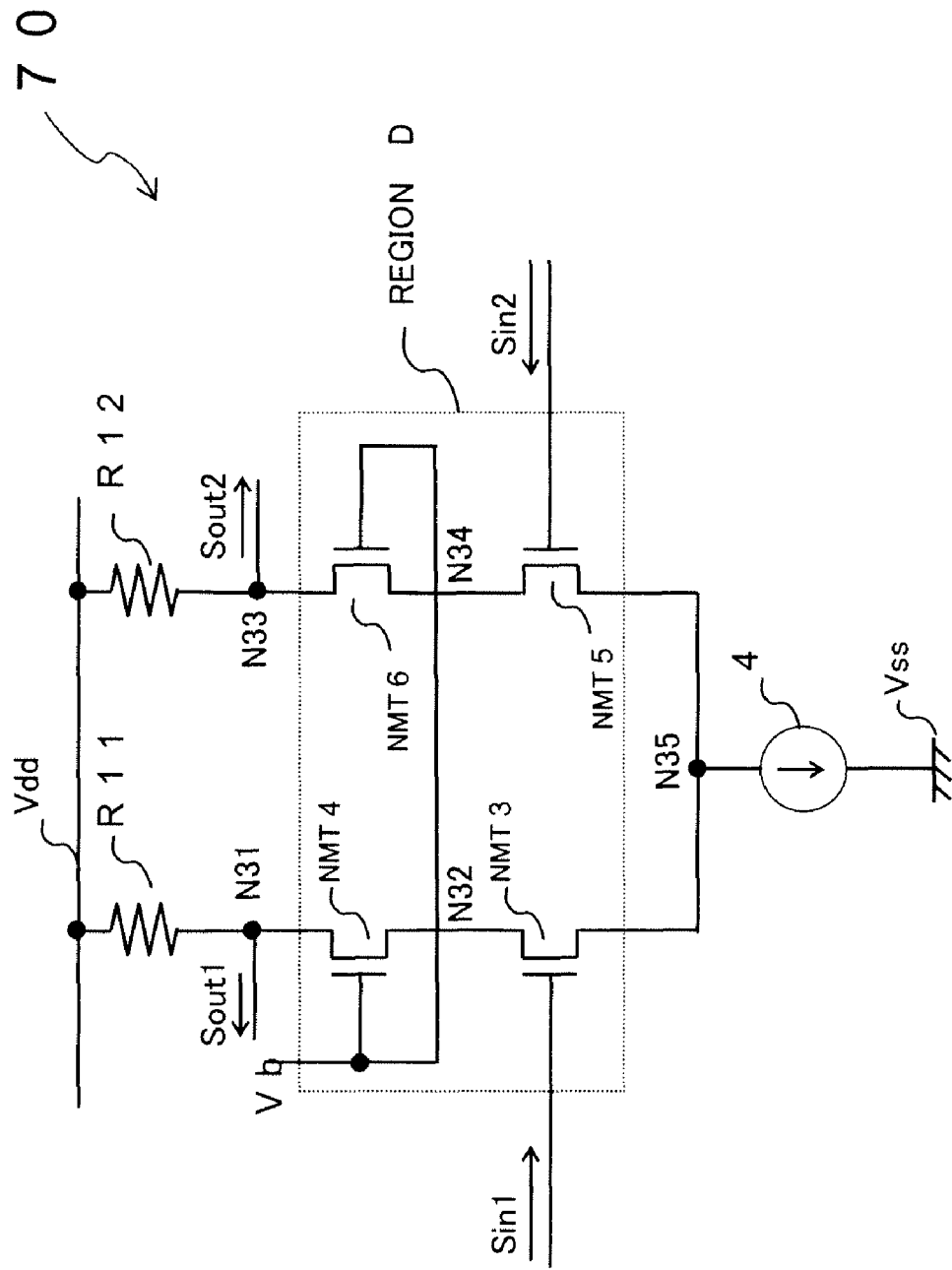
FIG. 8 is a circuit diagram that shows a cascoded differential amplifier according to a fifth embodiment of the present invention.

A cascoded circuit according to the fifth embodiment of the present invention will be described referring to the drawings. FIG. 8 is a circuit diagram that shows a cascoded differential amplifier. In this embodiment, N channel MOS transistors that constitute the cascoded differential amplifier are formed in the same active region.

As shown in FIG. 8, a cascoded differential amplifier 70 is provided with N channel MOS transistors NMT3 to NMT6, a resistance R11, a resistance R12 and a current source 4. Here, the N channel MOS transistors NMT3 to NMT6 are disposed in a region D in the figure and are E type (enhancement type) transistors (also called as normally-off type transistors). The N channel MOS transistors NMT3 to NMT6 are turned off when a voltage is not supplied to their gates, and are turned on when a voltage is supplied to their gates. The cascoded differential amplifier 70 can provide high output impedance as compared to a one-stage differential amplifier. Thereby, the property fluctuation caused by the power supply voltage variation can be reduced, and the feedback from the output side to the input side can be decreased.

The one end of the resistance R11 is connected to the higher voltage source Vdd. The other end of the resistance R11 is connected to the node N31. The one end of the resistance R12 is connected to the higher voltage source Vdd. The other end of the resistance R12 is connected to the node N33.

A drain of the N channel MOS transistor NMT4 is connected to the node N31. A source of the N channel MOS transistor NMT4 is connected to the node N32. The N channel MOS transistor NMT4 is turned on when a bias voltage Vb is input into the gate of the N channel MOS transistor NMT4. A drain of the N channel MOS transistor NMT6 is connected to the node N33. A source of the N channel MOS transistor NMT6 is connected to the node N34. The N channel MOS transistor NMT6 is turned on when the bias voltage Vb is input into the gate of the N channel MOS transistor NMT6.

A drain of the N channel MOS transistor NMT3 is connected to the node N32. A source of the N channel MOS transistor NMT3 is connected to the node N35. An input signal Sin 1 is input into the gate of the N channel MOS transistor NMT3. A drain of the N channel MOS transistor NMT5 is connected to the node N34. A source of the N channel MOS transistor NMT5 is connected to the node N35. An input signal Sin 2 is input to the gate of the N channel MOS transistor NMT5. The N channel MOS transistor NMT3 and the N channel MOS transistor NMT5 constitute a differential pair.

The one end of the current source 4 is connected to the node N35. The other end of the current source 4 is connected to the lower voltage source Vss. The current source 4 flows a bias current from the node N35 side to the lower voltage source Vss side. Here, the lower voltage source Vss is a ground voltage. This bias current causes the cascoded differential amplifier 70 to operate. An output signal Sout 1 is output from the node N31, and an output signal Sout 2 is output from the node N33.

The N channel MOS transistors NMT3 and NMT5 are set, for example, at a threshold voltage Vth 7. The N channel MOS transistors NMT4 and NMT6 are set, for example, at a threshold voltage Vth 8. The threshold voltage Vth 7 and the threshold voltage Vth 8 are set as the following formula:

$$Vth7 > Vth8 \qquad \text{Formula (4).}$$

When the voltages are set as in Formula (4), the voltages (voltages between the drains and the sources) applied to the N channel MOS transistors NMT4 and NMT6 can be made smaller than the voltages (voltages between the drains and the sources) applied to the N channel MOS transistors NMT3 and NMT5. By the setting of two kinds of threshold voltages, the power supply voltage margin of the cascoded differential amplifier 70 can be made larger than that of a cascoded differential amplifier with one kind of threshold voltage. Accordingly, the cascoded differential amplifier 70 can operate at a low voltage.

Figure 9:
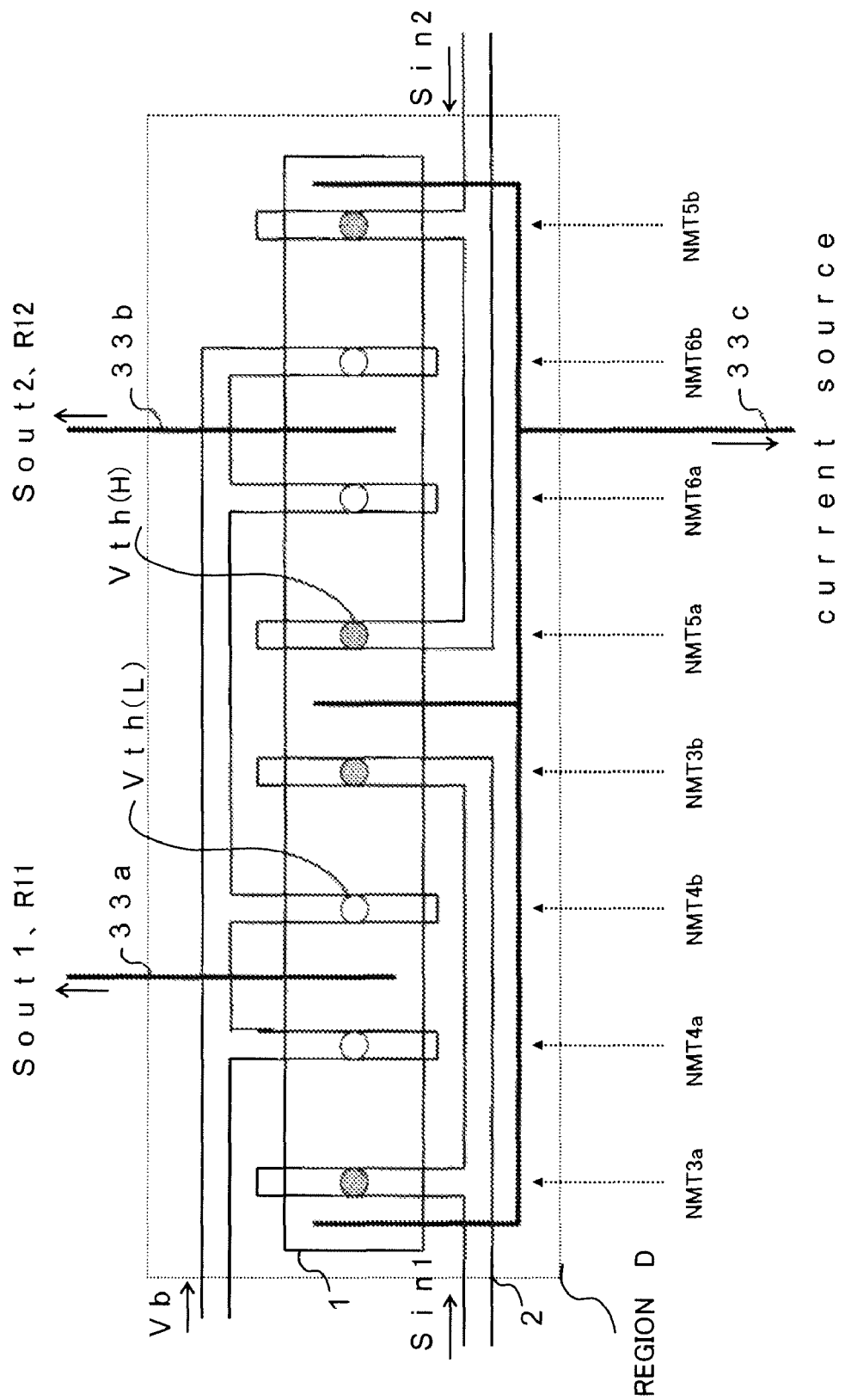
FIG. 9 is a schematic plan view that shows a pattern layout of a region D of FIG. 8.

A pattern arrangement method of a cascoded differential amplifier will be described referring to FIG. 9. FIG. 9 is a schematic plan view that shows a pattern layout of the region D of FIG. 8.

As shown in FIG. 9, the N channel MOS transistors NMT3 to NMT6 are provided in the same active region 1, and the gates of these transistors are arranged in parallel with each other. Each gate (gate electrode) has a two finger structure. The gate electrodes of the N channel MOS transistor NMT3 are bundled into the same gate electrode/gate wiring 2 (input signal Sin 1 side). The gate electrodes of the N channel MOS transistor NMT5 are bundled into the same gate electrode/ gate wiring 2 (input signal Sin 2 side). The gate electrodes of the N channel MOS transistors NMT4 and NMT6 are bundled into the same gate electrode/gate wiring 2 (bias voltage Vb side). The gate lengths of the finger parts are formed into the same dimension, and the gate widths of the finger parts are formed into the same dimension.

The N channel MOS transistor NMT3 has N channel MOS transistor finger parts NMT3a and NMT3b. The N channel MOS transistor NMT4 has N channel MOS transistor finger parts NMT4a and NMT4b. The N channel MOS transistor NMT5 has N channel MOS transistor finger parts NMT5a and NMT5b. The N channel MOS transistor NMT6 has N channel MOS transistor finger parts NMT6a and NMT6b. The P channel MOS transistor finger parts are arranged in parallel with each other in the X direction of the active region 1.

The N channel MOS transistor finger part NMT3a is a high threshold transistor Vth (H). The N channel MOS transistor finger part NMT3a is provided at the end of the active region 1, and has a source disposed on the end side of the active region 1. A wiring metal 33c connected to the current source 4 to the source of the N channel MOS transistor finger part NMT3a.

The N channel MOS transistor finger part NMT4a is a low threshold transistor Vth (L). The source of the N channel MOS transistor finger part NMT4a shares the same diffused layer with the drain of the N channel MOS transistor finger part NMT3a. A wiring metal 33a connected to the node N31 side is provided to the drain of the N channel MOS transistor finger part NMT4a. The high threshold transistor Vth (H) and the low threshold transistor Vth (L) can be formed by, for example, changing the channel ion implantation conditions for threshold voltage adjustment (such as a channel dosage).

The N channel MOS transistor finger part NMT4b is a low threshold transistor Vth (L). The drain of the N channel MOS transistor finger part NMT4b shares the same diffused layer with the drain of the N channel MOS transistor finger part NMT4a. The wiring metal 33a connected to the node N31 side is provided to the drain of the N channel MOS transistor finger part NMT4b.

The N channel MOS transistor finger part NMT3b is a high threshold transistor Vth (H). The drain of the N channel MOS transistor finger part NMT3b shares the same diffused layer with the source of the N channel MOS transistor finger part NMT4b. The wiring metal 33c connected to the current source 4 is provided to the source of the N channel MOS transistor finger part NMT3b.

The N channel MOS transistor finger part NMT5a is a high threshold transistor Vth (H). The source of the N channel MOS transistor finger part NMT5a shares the same diffused layer with the source of the N channel MOS transistor finger part NMT3b. The wiring metal 33c connected to the current source 4 is provided to the source of the N channel MOS transistor finger part NMT5a.

The N channel MOS transistor finger part NMT6a is a low threshold transistor Vth (L). The source of the N channel MOS transistor finger part NMT6a shares the same diffused layer with the drain of the N channel MOS transistor finger part NMT5a. A wiring metal 33b connected to the node N33 side is provided to the drain of the N channel MOS transistor finger part NMT6a.

The N channel MOS transistor finger part NMT6b is a low threshold transistor Vth (L). The drain of the N channel MOS transistor finger part NMT6b shares the same diffused layer with the drain of the N channel MOS transistor finger part NMT6a. The wiring metal 33b connected to the node N33 side is provided to the drain of the N channel MOS transistor finger part NMT6b.

The N channel MOS transistor finger part NMT5b is a high threshold transistor Vth (H). The drain of the N channel MOS transistor finger part NMT5b shares the same diffused layer with the source of the N channel MOS transistor finger part NMT6b. The wiring metal 33c connected to the current source 4 is provided to the source of the N channel MOS transistor finger part NMT5b. The N channel MOS transistor finger parts NMT3a, NMT3b, NMT4a, NMT4b, NMT5a, NMT5b, NMT6a and NMT6b are arranged in parallel with each other. Here, the arrangement of the sources or the drains does not need to be considered even when the number of the fingers is odd or even.

On the other hand, when the N channel MOS transistors NMT3 and NMT5, having the threshold voltage Vth 7, and the N channel MOS transistors NMT4 and NMT6, having the threshold voltage Vth 8, are provided in separate active regions, the order of the sources or the drains needs to be matched.

As a result, in this Embodiment, the area of the pattern layout can be reduced as compared with the case where transistors are provided in separate active regions. In addition, when transistors constituting a cascoded differential amplifier are provided in separate active regions, the characteristics of the transistors, such as a threshold voltage, are varied by being influenced by the stress from the STI and the like forming the device isolation region. In particular, the difference in the dimensions of the separate active regions in the width direction of the gates of the transistors makes the situation more remarkable. On the other hand, this embodiment can suppress the stress and reduce the variation of the characteristics of the transistors.

As described above, the cascoded circuit of this embodiment is provided with the N channel MOS transistors NMT3 to NMT6, the resistance R11, the resistance R12 and the current source 4. The N channel MOS transistor NMT4 having the gate to which the bias voltage Vb is applied and the N channel MOS transistor NMT3 having the gate to which the input signal Sin 1 is input are cascode-connected between the node N31 and the node N35. The N channel MOS transistor NMT6 having the gate to which the bias voltage Vb is applied and the N channel MOS transistor NMT5 having the gate to which the input signal Sin 2 is input are cascode-connected between the node N33 and the node N35. The N channel MOS transistor NMT3 and the N channel MOS transistor NMT5 constitute a differential pair. The threshold voltages of the N channel MOS transistors NMT3 and NMT5, which are disposed on the lower voltage source Vss side, are set larger than the threshold voltages of the N channel MOS transistors NMT4 and NMT6. The gates of the N channel MOS transistors NMT3 to NMT6 are arranged in the active region 1 in parallel with each other.

Therefore, the power supply voltage margin of the cascoded differential amplifier 70 can be enlarged as compared with the case where the threshold voltages of the N channel MOS transistors are identical. Thereby, the cascoded differential amplifier 70 can operate at a low voltage. Furthermore, the area of the pattern layout of the cascoded differential amplifier can be reduced as compared with the case where N channel MOS transistors constituting a cascoded differential amplifier are each provided in separate active regions. The variation of the characteristics of the transistors can be decreased.

The present invention is not limited to the above-described embodiments. Various modifications can be made without departing from the scope of the invention.

For instance, in the present embodiments, the circuits are each configured with the MOS transistors. Alternatively, MIS (Metal Insulator Semiconductor) transistors may be used to constitute circuits. Moreover, in the fifth embodiment, the cascoded differential amplifier is configured with the N channel MOS transistors. Alternatively, P channel MOS transistors may be used instead. A MOS transistor is also called a MOSFET. A MIS transistor is also called a MISFET. A MOS transistor and a MIS transistor are also called an Insulated Gate Field Effect Transistor.

What is claimed is:

1. A cascoded circuit, comprising:
   a first transistor having a drain electrically to connect to a higher voltage source;
   a second transistor having a drain connected to a source of the first transistor, the second transistor having a source electrically to connect to a lower voltage source;
   a third transistor having a drain electrically to connect to the higher voltage source; and
   a fourth transistor having a drain connected to a source of the third transistor, the fourth transistor having a source electrically to connect to the lower voltage source,
   wherein the first transistor, the second transistor, the third transistor and the fourth transistor are N channel insulated gate field effect transistors, the threshold voltages of the second transistor and the fourth transistor are larger than those of the first transistor and the third transistor, and wherein the first transistor, the second transistor, the third transistor and the fourth transistor are formed in the same active region, and gates of the first transistor, the second transistor, the third transistor and the fourth transistor are arranged in parallel with each other.

2. The cascoded circuit according to claim 1, wherein the drain of the first transistor is connected to the gates of the first transistor, the second transistor, the third transistor and the fourth transistor.

3. The cascoded circuit according to claim 1, wherein the second transistor and the fourth transistor constitute a differential pair, a first input signal is entered to the gate of the second transistor, and a second input signal is entered to the gate of the fourth transistor.

4. The cascoded circuit according to claim 1, wherein the first transistor, the second transistor, the third transistor and the fourth transistor have a plurality of fingers arranged in parallel with each other, respectively.

5. The cascoded circuit according to claim 4, wherein the active region has a rectangular region.

6. The cascoded circuit according to claim 4, wherein the gate lengths of the plurality of fingers of the first transistor, the second transistor, the third transistor and the fourth transistor have the same dimensions.

7. A cascoded circuit, comprising:
   a first transistor having a source electrically to connect to a higher voltage source;
   a second transistor having a source connected to a drain of the first transistor, the second transistor having a drain electrically to connect to a lower voltage source;
   a third transistor having a source electrically to connect to the higher voltage source; and
   a fourth transistor having a source connected to a drain of the third transistor, the fourth transistor having a drain electrically to connect to the lower voltage source,
   wherein the first transistor, the second transistor, the third transistor and the fourth transistor are P channel insulated gate field effect transistors, the absolute values of the threshold voltages of the first transistor and the third transistor are larger than those of the second transistor and the fourth transistor, and wherein the first transistor, the second transistor, the third transistor and the fourth transistor are formed in the same active region, and gates of the first transistor, the second transistor, the third transistor and the fourth transistor are arranged in parallel with each other.

8. The cascoded circuit according to claim 7, wherein the drain of the second transistor is connected to the gates of the first transistor, the second transistor, the third transistor and the fourth transistor.

9. The cascoded circuit according to claim 7, wherein the first transistor and the third transistor constitute a differential pair, a first input signal is entered to the gate of the first transistor, and a second input signal is entered to the gate of the third transistor.

10. The cascoded circuit according to claim 7, wherein the first transistor, the second transistor, the third transistor and the fourth transistor have a plurality of fingers arranged in parallel with each other, respectively.

11. The cascoded circuit according to claim 10, wherein the active region has a rectangular region.

12. The cascoded circuit according to claim 10, wherein the gate lengths of the plurality of fingers of the first transistor, the second transistor, the third transistor and the fourth transistor have the same dimensions.

13. The cascoded circuit according to claim 1, wherein the active region is a region which is separated by a device isolation region.

14. The cascoded circuit according to claim 7, wherein the active region is a region which is separated by a device isolation region.

* * * * *